(12) United States Patent
Oe

(10) Patent No.: US 6,354,430 B1
(45) Date of Patent: Mar. 12, 2002

(54) PRINTED-WIRING-BOARD CONVEYING METHOD AND PRINTED-WIRING-BOARD CONVEYOR

(75) Inventor: Kunio Oe, Chiryu (JP)

(73) Assignee: Fuji Machine Mfg., Ltd., Chiryu (JP)

( * ) Notice: Subject to any disclaimer, the term of this patent is extended or adjusted under 35 U.S.C. 154(b) by 0 days.

(21) Appl. No.: 09/610,434

(22) Filed: Jul. 3, 2000

(30) Foreign Application Priority Data

Jul. 26, 1999 (JP) .......................................... 11-210686

(51) Int. Cl.[7] ........................ B65G 15/12; B65G 15/14; B65G 15/20
(52) U.S. Cl. ................... 198/626.6; 198/465.3; 198/817
(58) Field of Search ..................... 198/465.3, 626.5, 198/626.6, 817

(56) References Cited

U.S. PATENT DOCUMENTS

| | | | | |
|---|---|---|---|---|
| 4,014,428 A | * | 3/1977 | Ossbahr | 198/345 |
| 4,538,398 A | * | 9/1985 | Marchetti | 198/627 |
| 4,650,060 A | * | 3/1987 | Storimans | 198/459 |
| 4,823,940 A | * | 4/1989 | Crester | 198/817 |
| 4,856,956 A | * | 8/1989 | Zur | 414/280 |
| 5,269,119 A | * | 12/1993 | Tolson | 53/374.3 |
| RE35,243 E | * | 5/1996 | Tolson | 198/326.5 |
| 5,576,520 A | * | 11/1996 | Waterman et al. | 198/817 |
| 5,657,856 A | * | 8/1997 | Von Froreich | 198/817 |
| 5,967,398 A | * | 10/1999 | Fritz, Sr. | 198/626.6 |
| 6,032,788 A | * | 3/2000 | Smithers et al. | 198/817 |
| 6,082,526 A | * | 7/2000 | Baker et al. | 198/817 |
| 6,109,426 A | * | 8/2000 | Messer | 198/817 |
| 6,176,367 B1 | * | 1/2001 | Patrito | 198/817 |

FOREIGN PATENT DOCUMENTS

JP A-10-163683 6/1998

* cited by examiner

*Primary Examiner*—Christopher P. Schwartz
*Assistant Examiner*—Devon Kramer
(74) *Attorney, Agent, or Firm*—Oliff & Berridge, PLC

(57) ABSTRACT

A method of causing a wound-on member to contact a printed wiring board and conveying the printed wiring board by utilizing a frictional force produced between the wound-on member and the printed wiring board, the method including the steps of providing two conveying units each of which includes a wound-on member and two rotatable wheels on which the wound-on member is wound to have a straightly extending portion which straightly extends between the two rotatable wheels, such that the two conveying units are spaced from each other in a direction parallel to a printed wiring board, and such that the respective straightly extending portions of the two wound-on members of the two conveying units cooperate with each other to sandwich the printed wiring board in a direction substantially parallel to the printed wiring board, and conveying the printed wiring board by rotating the rotatable wheels of the two conveying units, and thereby moving the two wound-on members, while utilizing a frictional force produced between each of the two wound-on members and the printed wiring board.

25 Claims, 8 Drawing Sheets

PRINTED-WIRING-BOARD CONVEYING METHOD AND PRINTED-WIRING-BOARD CONVEYOR

BACKGROUND OF THE INVENTION

1. Field of Invention

The present invention relates to a printed-wiring-board conveying method and a printed-wiring-board conveyor and particularly to the improvements of such a printed-wiring-board conveying method and a printed-wiring-board conveyor each of which employs a wound-on member, such as a belt, for conveying a printed wiring board.

2. Related Art Statement

There is known a printed-wiring-board ("PWB") conveyor which includes an endless, annular conveyor belt, a plurality of pulleys on which the conveyor belt is wound, and a drive device which drives or rotates at least one of the pulleys. The conveyor belt includes a straightly and horizontally extending portion which directly supports a lower surface of a PWB. When one pulley is rotated by the drive device and accordingly the conveyor belt is moved, the PWB is conveyed by a frictional force produced between the PWB and the conveyor belt.

However, the above-indicated PWB conveyor has some problems. For example, the speed at which the PWB is conveyed has an upper limit, and accordingly it is difficult to improve the efficiency of conveying of PWBs. Though the PWB is conveyed by the frictional force produced between the PCB and the conveyor belt, as indicated above, the frictional force depends on the weight of the PWB and the coefficient of friction between the PWB and the conveyor belt. Therefore, the PWB cannot be conveyed at an acceleration greater than a maximum or upper-limit acceleration depending on gravitational acceleration.

In addition, since the above-indicated PWB conveyor conveys the PWB while supporting the lower surface thereof, many elements of the PWB conveyor are provided under the PWB, so that little free space is left under the PWB. Thus, it is not easy to provide another or other devices under the PWB. In addition, the PWB conveyor cannot help having a great vertical dimension. Thus, the conventional PWB conveyor suffers from a low degree of freedom.

SUMMARY OF THE INVENTION

The present invention provides a printed-wiring-board conveying method and a printed-wiring-board conveyor that have one or more of the following technical features that are described below in respective paragraphs given parenthesized sequential numbers (1) to (18). Any technical feature that includes another technical feature shall do so by referring, at the beginning, to the parenthesized sequential number given to the latter feature. Thus, two or more of the following technical features may be combined, if appropriate. Each technical feature may be accompanied by a supplemental explanation, as needed. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items of that technical feature.

(1) According to a first feature of the present invention, there is provided a method of causing a wound-on member to contact a printed wiring board and conveying the printed wiring board by utilizing a frictional force produced between the wound-on member and the printed wiring board, the method comprising the steps of providing two conveying units each of which includes a wound-on member and two rotatable wheels on which the wound-on member is wound to have a straightly extending portion which straightly extends between the two rotatable wheels, such that the two conveying units are spaced from each other in a direction parallel to a printed wiring board, and such that the respective straightly extending portions of the two wound-on members of the two conveying units cooperate with each other to sandwich the printed wiring board in a direction substantially parallel to the printed wiring board, and conveying the printed wiring board by rotating the rotatable wheels of the two conveying units, and thereby moving the two wound-on members, while utilizing a frictional force produced between each of the two wound-on members and the printed wiring board. The printed wiring board may be one on which electric components ("ECs") have been mounted and electrically connected to electric circuits, or one on which no electric components have been mounted. At least one of the rotatable wheels may be driven by a drive device, and this rotatable wheel will be referred to as the "drive rotatable wheel". Since the printed wiring board ("PWB") is conveyed while being sandwiched by the two conveying units in the direction substantially parallel to the upper and lower major surfaces of the PWB, the two conveying units can be provided on both sides of the PWB and accordingly a large space can be left under the PWB. In addition, the two conveying units can be easily constructed so as to be generally flat as seen in the direction parallel to the PWB. Moreover, in the case where the two wound-on members contact the PWB with a contact force greater than the weight of the PWB, the two wound-on members can move the PWB at an acceleration higher than a maximum acceleration that can be achieved depending on gravitational acceleration. The last advantage contributes to increasing the speed at which the PWB is conveyed and thereby improving the efficiency of conveying of PWBs. The present PWB conveying method may employ at least one of the second to eighteenth features (2) to (18) of the PWB conveyor, described below.

(2) According to a second feature of the present invention, there is provided a printed-wiring-board conveyor, comprising at least one wound-on member; at least two rotatable wheels on which the wound-on member is wound to have a straightly extending portion which straightly extends between the two rotatable wheels and which contacts a printed wiring board; a drive device which drives at least one of the two rotatable wheels and moves the wound-on member while utilizing a frictional force produced between the wound-on member and the printed wiring board; and a contact-force producing device which causes the straightly extending portion of the wound-on member and the printed wiring board to contact each other with a contact force greater than a weight of the printed wiring board. The wound-on member may be a belt such as a V-belt, a round belt, a flat belt, or a cog belt (i.e., a timing belt); a wire; or a chain. The rotatable wheels may be pulleys such as V-pulleys or flat pulleys; or sprockets, and can be selected corresponding to the sort of the wound-on member employed. The rotatable wheels may be ones which are rotatable about respective axis lines intersecting a reference plane parallel to the PWB, or about respective axis lines parallel to the reference plane. In the former case, the respective axis lines of the rotatable wheels may be perpendicular to the reference plane and, in this case, the wound-on member is circulated on a plane parallel to the reference plane; and in the latter case, the wound-on member is circulated on a plane perpendicular to the reference plane. However, depending upon the circumstances, the rotatable wheels may be rotated, as needed, about respective axis lines whose directions differ from each other, so that the wound-on member is circulated on a curved surface. The PWB may be conveyed in a horizontal direction, or in a direction inclined relative to a horizontal direction. The present PWB conveyor may employ two conveying units according to the third feature (3), at least three conveying units according to the fifteenth feature (15), or at least one conveying unit according to the seventeenth feature (17). In the third feature (3), the two conveying units convey the PWB while sandwiching the PWB in a direction substantially parallel to the above-indicated reference plane. In the fifteenth feature (15), two conveying units convey the PWB while sandwiching the PWB in a direction substantially parallel to the reference plane, and one conveying unit conveys the PWB while supporting the lower surface of the PWB. In the seventeenth feature (17), the conveying unit conveys the PWB while supporting the lower surface of the PWB. In each case, the contact-force producing device causes the wound-on member and the PWB to contact with each other with a contact force which is greater than a contact force produced by the weight of the PWB, and accordingly the PWB can be quickly conveyed at an acceleration and a deceleration which are greater than those employed in the conventional PWB conveyors.

(3) According to a third feature of the present invention that includes the second feature (2), the conveyor comprises two wound-on members, and four rotatable wheels on which the two wound-on members are wound to have respective straightly extending portions each of which straightly extends between corresponding two rotatable wheels of the four rotatable wheels and each of which contacts the printed wiring board, and the respective straightly extending portions of the two wound-on members extend parallel to each other in a first direction and are spaced from each other in a second direction, and the contact-force producing device biases one of the respective straightly extending portions of the two wound-on members, toward the other straightly extending portion. The present PWB conveyor includes two conveying units. Respective drive devices of the two conveying units may include a common drive source which is connected to respective drive rotatable wheels of the two conveying units that are mechanically coupled with each other. In this case, the two wound-on members are circulated at the same speed. Alternatively, the respective drive devices of the two conveying units may include respective exclusive drive sources which are so controlled as to rotate in synchronism with each other and thereby circulate the two wound-on members at the same speed. The PWB is conveyed while being sandwiched by the two wound-on members in a direction substantially parallel to the reference plane. In the case where the PWB is conveyed in a horizontal direction and it is assumed that the PWB is conveyed at an acceleration, $\alpha$, the PWB has a mass, m, and gravitational acceleration is g, the PWB receives a composite force, $m \cdot \sqrt{(g^2+\alpha^2)}$, of the vertical-direction gravitational force, $m \cdot g$, and the horizontal-direction inertia force, $m \cdot \alpha$. On the other hand, if it is assumed that each conveying unit and the PWB contact each other with a contact force, F, and a friction coefficient is $\mu$, a conveying force that can be applied to the PWB owing to the summed contact forces 2F is equal to $2 \mu F$. Therefore, if $2 \mu F > m \cdot \sqrt{(g^2+\alpha^2)}$, the PWB can be conveyed with the contact force F. In contrast, in the conventional PWB conveyor wherein a conveyor belt conveys a PWB while supporting a lower surface of the PWB, the frictional force produced between the PWB and the conveyor belt is equal to $\mu \cdot m \cdot g$, and the maximum acceleration $\alpha_{max}$ at which the PWB is conveyed by the frictional force is equal to $\mu \cdot g$ (i.e., $\alpha_{max} = \mu \cdot g$). Therefore, if the contact force F that satisfies the condition that $F > \{m \cdot g \cdot \sqrt{(1+\mu^2)}\}/2\mu$ is produced between the conveying units and the PWB, the PWB can be conveyed at an acceleration higher than that at which the PWB is conveyed by the conventional PWB conveyor. The present PWB conveyor can convey the PWB at a higher acceleration than the conventional PWB conveyor and can enjoy the above-described advantages of the PWB conveying method according to the first feature (1).

(4) According to a fourth feature of the present invention that includes the third feature (3), the contact-force producing device comprises at least one freely rotatable member which is rotatable about an axis line perpendicular to the first and second directions and which contacts one of opposite surfaces of the one straightly extending portion that is opposite to the other surface thereof at which the one straightly extending portion contacts the printed wiring board; and a biasing device which applies a biasing force to the freely rotatable member in a direction in which the one straightly extending portion is biased toward the other straightly extending portion. The freely rotatable member may be a roller or a ball. One or more rotatable wheels on which one wound-on member is wound may be used as one or more freely rotatable members. The position of the freely rotatable member in the direction of movement of the one wound-on member is not changeable, but the rotation of the freely rotatable member allows the movement of the one wound-on member. Thus, the freely rotatable member presses the one wound-on member against one side surface of the PWB, without interfering with the conveying of the PWB by the two wound-on members.

(5) According to a fifth feature of the present invention that includes the fourth feature (4), the contact-force producing device comprises a plurality of freely rotatable members, and a support member which supports the freely rotatable members along a straight line parallel to the one straightly extending portion, the biasing device being connected to the support member. The freely rotatable members press the one wound-on member against the one side surface of the PWB, since the biasing device biases the support member. Since the plurality of freely rotatable members press a plurality of portions of the straightly extending portion of the one wound-on member against the PWB, the two wound-on members can move the PWB straightly without tilting the same. In addition, since the biasing device biases the support member, the plurality of freely rotatable members are altogether pressed against the one wound-on member via the support member. Thus, the biasing device enjoys a simple construction.

(6) According to a sixth feature of the present invention that includes the fifth feature (5), the contact-force producing device further comprises a stopper which stops movement of the support member caused by the biasing force of the biasing device and thereby defines a limit of the movement of the support member. In the case where the present PWB conveyor employs the moving device according to the thirteenth feature (13), the stopper can accurately define the position of the one wound-on member which is in the state in which the one wound-on member is not in contact with the PWB and, owing to this effect, the distance by which the one wound-on member should be moved by the moving device can be decreased. In addition, even in the case where the moving device is not employed, the stopper contributes to easily providing the freely rotatable members supported by the support member, at respective positions where the freely rotatable members do not interfere with the conveying of the PWB caused by the two wound-on members into the space left between the two wound-on members. If the position of the stopper is adjustable, the above-indicated limit of movement of the support member is adjustable.

(7) According to a seventh feature of the present invention that includes the fourth feature (4), the contact-force producing device comprises a plurality of the freely rotatable members, a support member which supports the freely rotatable members along a straight line parallel to the one straightly extending portion, such that each of the freely rotatable members is movable in a direction perpendicular to the straight line, and a plurality of the biasing devices each of which is provided between the support member and a corresponding one of the freely rotatable members and biases the one freely rotatable member relative to the support member toward the one straightly extending portion. Since the plurality of freely rotatable members are individually pressed against the one wound-on member, each freely rotatable member can press the one wound-on member against the PWB with an appropriate pressing force even if the one side surface of the PWB is uneven.

(8) According to an eighth feature of the present invention that includes the seventh feature (7), the contact-force producing device further comprises a plurality of stoppers each of which stops movement relative to the support member of a corresponding one of the freely rotatable members caused by the biasing force of a corresponding one of the biasing devices and thereby defines a limit of the movement of the one freely rotatable member. The present PWB conveyor enjoys the same advantages as those of the PWB conveyor according to the sixth feature (6).

(9) According to a ninth feature of the present invention that includes any one of the fourth to eighth features (4) to (8), the biasing device comprises an elastic member which applies, as the biasing force, an elastic force to the freely rotatable member. The elastic member may be a spring such as a compression coil spring, or a member formed of rubber. The elastic force of the elastic member is so selected as to assure that owing to the contact force produced between the PWB and the two wound-on members, a frictional force greater than the gravitational force and the inertia force both of which are exerted to the PWB is obtained, as described previously. However, the elastic force or the contact force may be a prescribed constant value, or may be an adjustable value. In the latter case, the elastic force or the contact force may be adjusted depending on the shape, size, and weight of each PWB to be conveyed and/or a desired acceleration.

(10) According to a tenth feature of the present invention that includes the fourth or seventh feature (4) or (7), the biasing device comprises a pressurized-air-operated cylinder device which applies, as the biasing force, an operating force to the freely rotatable member. In this case, the contact force (or the pressing force) depends on the pressure in the air chamber of the pressurized-air-operated cylinder device. The air pressure may be a prescribed constant value, or may be a changeable or adjustable value. In the latter case, the air pressure may be changed or adjusted depending on the shape, size, and weight of each PWB to be conveyed and/or a desired acceleration.

(11) According to an eleventh feature of the present invention that includes any one of the third to tenth features (3) to (10), the conveyor further comprises a support device which supports the other straightly extending portion on one of opposite sides thereof that is opposite to the other side thereof on which the one straightly extending portion is provided. When the contact-force producing device biases the one wound-on member toward the other wound-on member, the support device supports the other wound-on member, so that the two wound-on members can stably contact the PWB and convey the same.

(12) According to a twelfth feature of the present invention that includes the eleventh feature (11), the support device comprises a support member which has a contact surface which contacts one of opposite surfaces of the other straightly extending portion that is opposite to the other surface thereof at which the other straightly extending portion contacts the printed wiring board. The other wound-on member slides on the contact surface of the support member. Accordingly, it is preferred that the contact surface have a low friction coefficient. For example, the contact surface is coated with a material, such as Teflon, which has a low friction coefficient, so that the contact surface has a low friction coefficient. Alternatively, the support member may be formed of Teflon. In addition, an inner surface of the other wound-on member that contacts the contact surface may be formed to have a low friction coefficient. The support member may be provided by one or more freely rotatable members.

(13) According to a thirteenth feature of the present invention that includes any one of the third to twelfth features (3) to (12), the conveyor further comprises a moving device which moves at least one of the two wound-on members toward, and away from, the other wound-one member. The moving device moves one wound-on member toward the other wound-on member, so that the two wound-on members sandwich and convey the PWB. The moving device moves one wound-on member away from the other wound-on member, so that the two wound-on members do not contact the side surfaces of the PWB.

(14) According to a fourteenth feature of the present invention that includes any one of the second to thirteenth features (2) to (13), the two rotatable wheels comprise two pulleys and the wound-on member comprises a belt.

(15) According to a fifteenth feature of the present invention that includes any one of the second to fourteenth features (2) to (14), the respective straightly extending portions of the two wound-on members as a first and a second wound-on member are spaced from each other in a substantially horizontal direction as the second direction, and the conveyor further comprises at least two third rotatable wheels in addition to the four rotatable wheels as two first rotatable wheels on which the first wound-on member is wound and two second rotatable wheels on which the second wound-on member is wound, at least one third wound-on member which is provided between the respective straightly extending portions of the first and second wound-on members and which is wound on the two third rotatable wheels to have a straightly extending portion which straightly extends parallel to the respective straightly extending portions of the first and second wound-on members, and a second drive device which is different from the drive device as a first drive device and which drives at least one of the third rotatable wheels. The PWB conveyor may employ one or more third conveying units each of which includes two third rotatable wheels, a third wound-on member wound on the third rotatable wheels, and a third drive device which drives at least one of the third rotatable wheels. The one or more third conveying units support the lower surface of the PWB and can convey the same at an acceleration not higher than a maximum acceleration depending on gravitational acceleration. Respective drive devices of the first and second conveying units which horizontally sandwich the PWB and the one or more third conveying units which support the lower surface of the PWB, may employ a common drive source, or respective exclusive drive sources. The third conveying unit may be used to carry in the PWB to the first and second conveying units, or carry out the PWB from the latter conveying units, or may be used to just support, when the first and second conveying units horizontally sandwich the PWB, the lower surface of the PWB and thereby help the latter conveying units easily sandwich the PWB. In the former case, for example, the supplying of a PWB to the present PWB conveyor can be easily performed by a PWB conveyor of a type which conveys the PWB while supporting the lower surface thereof. When the first and second conveying units convey the PWB while sandwiching the PWB, the wound-on member of the third conveying unit may be kept spaced from the PWB, or may be kept in contact with the PWB. In the latter case, the wound-on member of the third conveying unit may be moved in synchronism with the respective wound-on members of the first and second conveying units, or may be kept stopped. When the third conveying unit conveys the PWB, the respective wound-on members of the first and second conveying units are kept spaced away from each other. During this operation, the respective wound-on members of the first and second conveying units may be moved in synchronism with each other, or may be kept stopped, so as to function as two guide members which guide the movement of the PWB.

(16) According to a sixteenth feature of the present invention that includes the fifteenth feature (15), the conveyor comprises two third wound-on members which correspond to the first and second wound-on members, respectively, and four third rotatable wheels on which the two third wound-on members are wound, two of which correspond to the two first rotatable wheels, and the other two of which correspond to the two second rotatable wheels. In the case where the present PWB conveyor employs a single third conveying unit, it is preferred that the third wound-on member and the third rotatable wheels have a great width in a widthwise direction of the PWB, i.e., a direction perpendicular to the PWB-convey direction, so that the third wound-on member supports at least the lower surface of a widthwise middle portion of the PWB. In this case, however, a space under the PWB is occupied by the elements of the third conveying unit. In contrast, the present PWB conveyor employs two third conveying units. If the two third conveying units are provided at respective positions distant from each other in the widthwise direction of the PWB, a free space can be obtained under the PWB.

(17) According to a seventeenth feature of the present invention that includes the second feature (2), the straightly extending portion of the wound-on member extends in a substantially horizontal direction, and the contact-force producing device comprises at least one freely rotatable member which is provided above the straightly extending portion of the wound-on member such that the freely rotatable member is freely rotatable about a substantially horizontal axis line perpendicular to the substantially horizontal direction, and which contacts an upper surface of the printed wiring board whose lower surface is supported on the straightly extending portion; and a biasing device which biases the freely rotatable member toward the upper surface of the printed wiring board. The contact-force producing device may be one which produces respective contact forces on both of widthwise opposite ends of the PWB as seen in the widthwise direction thereof, or one which produces a contact force on only one of the widthwise opposite ends of the PWB. According to the seventeenth feature (17), the PWB is pressed against the wound-on member owing to both the weight of the PWB and the biasing force of the biasing device. Thus, the contact force produced between the PWB and the wound-on member is naturally greater than the weight of the PWB, and accordingly the wound-on member can quickly move the PWB at an acceleration higher than a maximum acceleration depending upon gravitational acceleration. The present PWB conveyor may employ any one of the fifth to twelfth and fourteenth features (5) to (12) and (14).

(18) According to an eighteenth feature of the present invention that includes the seventeenth feature (17), the conveyor further comprises a moving device which moves the freely rotatable member toward, and away from, the straightly extending portion of the wound-on member. When the PWB is carried in onto the wound-on member, the freely rotatable member is moved away from the wound-on member and, after the carrying-in of the PWB, the freely rotatable member is moved toward the wound-on member to press the PWB against the wound-on member.

BRIEF DESCRIPTION OF THE DRAWINGS

The above and optional objects, features, and advantages of the present invention will be better understood by reading the following detailed description of the preferred embodiments of the invention, when considered in conjunction with the accompanying drawings, in which.

DETAILED DESCRIPTION OF THE PREFERRED EMBODIMENTS

Figure 1:
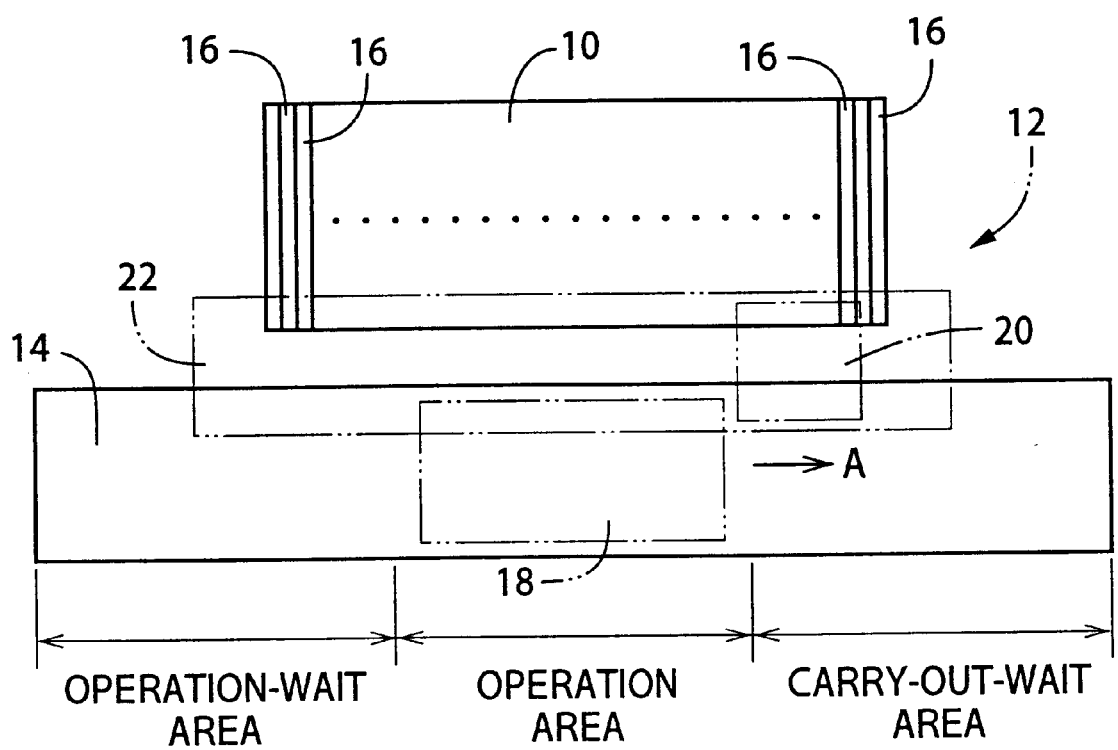
FIG. 1 is a schematic plan view of an electric-component ("EC") mounting system including a printed-wiring-board ("PWB") conveyor as a first embodiment of the present invention.
Figure 1:
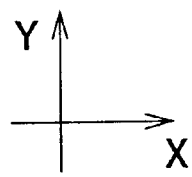
Figure 2:
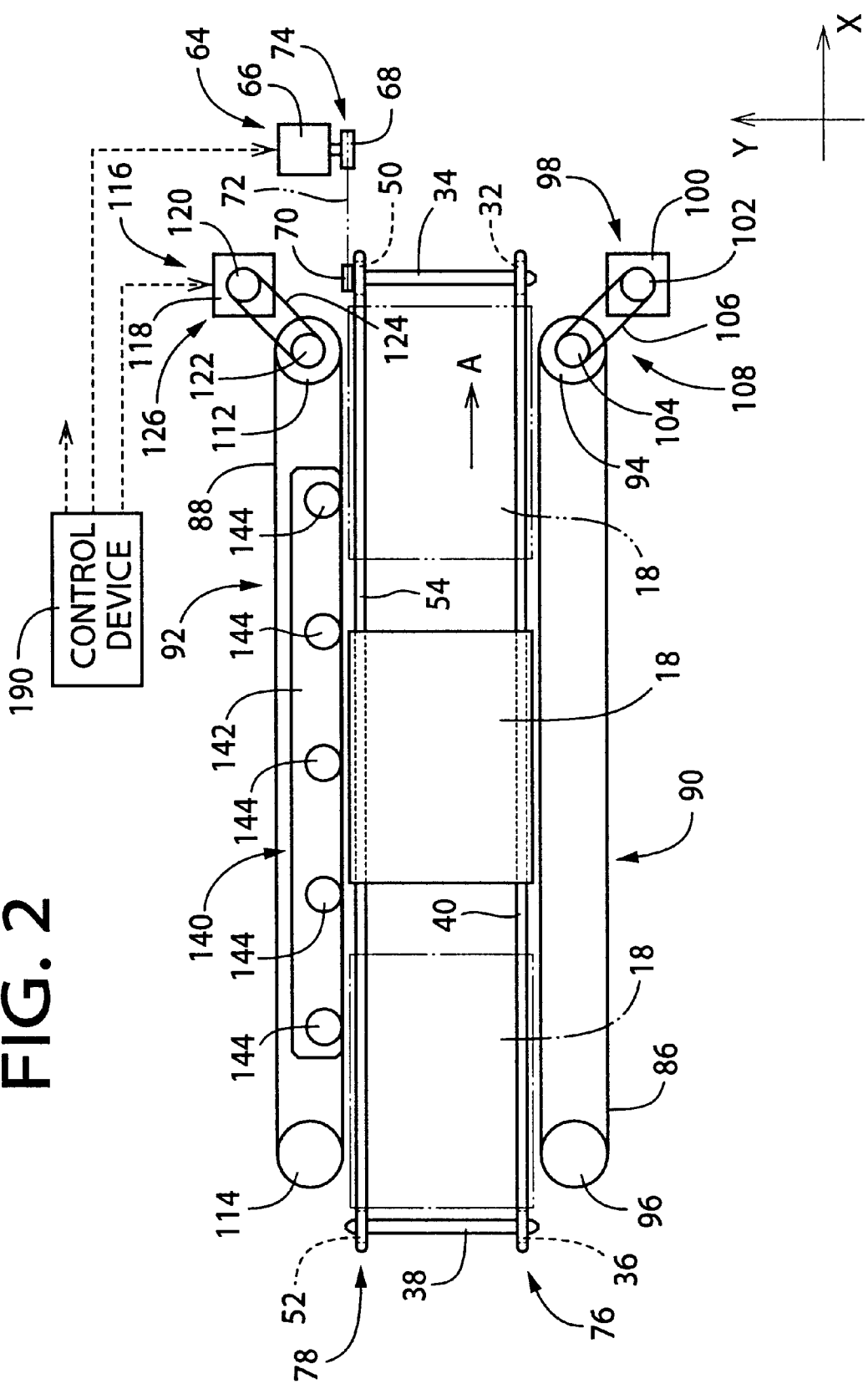
FIG. 2 is a plan view of the PWB conveyor of FIG. 1.
Figure 3:
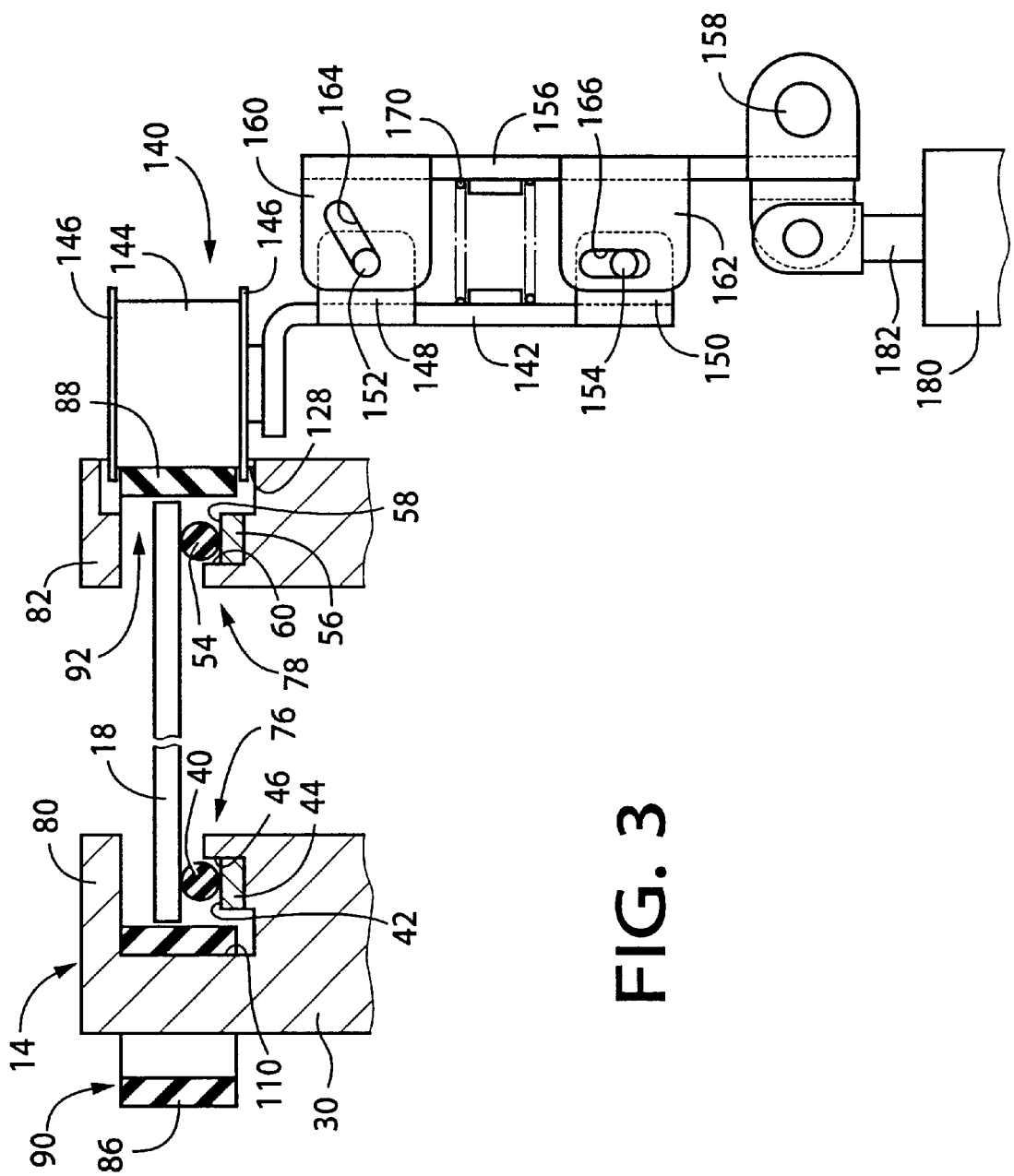
FIG. 3 is a partly cross-sectioned, side elevation view of the PWB conveyor of FIG. 1.

Referring first to FIGS. 1 to 3, there will be described a printed-wiring-board ("PWB") conveyor 14 that conveys a printed wiring board ("PWB") 18. The PWB conveyor 14 is employed in an electric-component ("EC") mounting system which is one of various systems belonging to a printed-circuit-board ("PCB") producing line and which mounts ECs on the PWB 18. The PWB conveyor 14 embodies the present invention.

As shown in FIG. 1, the EC mounting system includes an EC supplying device 10, an EC mounting device 12, and the PWB conveyor 14. Since the EC supplying device 10 and the EC mounting device 12 are known in the art, those devices 10, 12 will be briefly described below.

The EC supplying device 10 includes a plurality of EC feeders 16, and is fixed in position. Each EC feeder 16 feeds a carrier tape carrying a number of ECs thereon, and supplies the ECs one by one from a leading portion of the carrier tape that is positioned at an EC-supply portion of the feeder 16. The EC feeders 16 are detachably attached to a stationary table (not shown) such that the respective EC-supply portions of the feeders 16 are arranged along a reference line. In the present embodiment, the reference line is a straight line parallel to an X-axis direction. As the carrier tape is fed on each EC feeder 16, the ECs carried on the carrier tape are positioned one by one at the EC-supply portion of that feeder 16.

The PWB conveyor 14 conveys the PWB 18 in a PWB-convey direction, indicated at Arrow "A" in FIG. 1, parallel to the X-axis direction. The PWB conveyor 14 receives the PWB 18 from an upstream-side device (not shown) which is provided on an upstream side of the present EC mounting system as seen in the PWB-convey direction, i.e., in the X-axis direction, then conveys the PWB 18 to an operation area where the EC mounting device 12 mounts the ECs on the PWB 18 and, after the mounting of ECs, carries out the PWB 18 to a downstream-side device (not shown) which is provided on a downstream side of the EC mounting system. The PWB conveyor 14 is elongate in the PWB-convey direction. On an upstream side of the operation area, there is provided an operation-wait area where the PWB 18 waits for the mounting of ECs to be performed in the operation area; and on a downstream side of the operation area, there is provided a carry-out-wait area where the PWB 18 waits for being carried out to the downstream-side device. Each of those three areas has a size that can accommodate just one PWB 18. Hereinafter, the respective positions of the PWB 18 accommodated in those three areas will be referred to as an operation position, an operation-wait position, and a carry-out-wait position, respectively.

The EC mounting device 12 is disclosed in Japanese Patent Application laid open under Publication No. 10(1998)-163683. In short, the mounting device 12 includes a mounting head 20 having a plurality of EC holders, and an X-Y robot 22 as a head moving device that moves the mounting head 20 in the X-axis direction and a Y-axis direction perpendicular to the X-axis direction on a horizontal plane. The mounting head 20 includes a rotatable body which is rotatable about a vertical axis line and which supports the EC holders along a circle whose center rides on the vertical axis line, such that the EC holders are equiangularly spaced from each other about the vertical axis line. As the rotatable body is rotated, the EC holders are sequentially moved to an EC-hold-and-mount position. Each EC holder applies a negative pressure to each EC and thereby sucks and holds the EC. The X-Y robot 22 moves the mounting head 20 to an arbitrary position on the horizontal plane, so that the EC holders of the head 22 take the ECs from the EC feeders 16 and mount the ECs on the PWB 18. However, it is not essentially needed that the plurality of EC holders be supported by the rotatable body. For example, the plurality of EC holders may be provided on a slide member as part of the X-Y robot 22 such that the EC holders are fixed in position on the slide member, and may be replaced with a single EC holder.

Next, the PWB conveyor 14 will be described. In FIG. 3, reference numeral 30 designates a frame. The frame 30 supports, as shown in FIG. 2, a drive pulley 32 as a drive rotatable wheel via an axis member 34, such that the drive pulley 32 is rotatable about a first horizontal axis line perpendicular to the PWB-convey direction indicated at Arrow "A". The frame 30 also supports a driven pulley 36 as a driven rotatable wheel via an axis member 38, at a position distant from the drive pulley 32 in the PWB-convey direction, such that the driven pulley 36 is rotatable about a second horizontal axis line parallel to the first horizontal axis line. A round belt 40 as a wound-on member is wound on the drive and driven wheels 32, 36.

The round belt 40 is formed of a material, such as rubber, which has a friction coefficient of not smaller than 0.3 or not smaller than 0.4. This is true with a round belt 54 described later. The round belt 40 has an endless, annular shape, and an upper one of two portions of the belt 40 that extend between the drive and driven pulleys 32, 36 is supported, as shown in FIG. 3, on a horizontal support surface 42 of the frame 30, so that the movement of the upper portion of the belt 40 is guided by the support surface 42. The support surface 42 is provided by a plate member 44 which is fixed to the frame 30. The plate member 44 is formed of a material, such as Teflon, which has a low friction coefficient, and is elongate in the PWB-convey direction. However, the frame 30 may be formed with a horizontal surface which is elongate in the PWB-convey direction and which is coated with Teflon to provide the support surface 42. Thus, the upper portion of the round belt 40 that is supported on the horizontal support surface 42 extends horizontally and straightly. Hereinafter, the upper portion of the belt 40 will be referred to as the straightly extending portion of the belt 40. The frame 30 also has a vertical stopper surface 46 which is perpendicular to the horizontal support surface 42 and which prevents the round belt 40 from being moved out of position inward, i.e., toward the other round belt 54.

The axis member 34 is elongate, and another drive pulley 50 is fixed to the other end portion of the axis member 34 that is opposite to the one end portion thereof to which the drive pulley 32 is fixed. Likewise, the axis member 38 is elongate, and another driven pulley 52 is fixed to the other end portion of the axis member 38 that is opposite to the one end portion thereof to which the driven pulley 36 is fixed. The second round belt 54 as a wound-on member is wound on the drive and driven wheels 50, 52. The second round belt 54 has an endless, annular shape, like the first round belt 40. Like the first round belt 40, an upper one of two portions of the second round belt 54 that extend between the drive and driven pulleys 50, 52 is supported, as shown in FIG. 3, on a horizontal support surface 58 of the frame 30, so that the movement of the upper portion of the belt 54 is guided by the support surface 58. The support surface 58 is provided by a plate member 56 which is fixed to the frame 30. The plate member 56 is formed of Teflon, and is elongate in the PWB-convey direction. Thus, the upper portion of the second round belt 54 that is supported on the horizontal support surface 58 extends horizontally and straightly. Hereinafter, the upper portion of the belt 54 will be referred to as the straightly extending portion of the belt 54. The frame 30 also has a vertical stopper surface 60 which is perpendicular to the horizontal support surface 58 and which prevents the round belt 54 from being moved out of position inward, i.e., toward the first round belt 40. Thus the respective straightly extending portions of the two round belts 40, 54 are spaced from each other in the Y-axis direction and extend parallel to each other in the X-axis direction.

The two drive pulleys 32, 50 are rotated by a drive device 64. The drive device 64 has, as its drive source, a servomotor 66 which is an electric rotary motor and is controllable with respect to its rotation angle or amount. The rotation of the servomotor 66 is transmitted to the axis member 34 by a rotation transmitting device 74 including two timing pulleys 68, 70 and a timing belt 72, so that the two drive pulleys 32, 50 are simultaneously rotated and the two round belts 40, 54 are circulated at the same speed. The PWB 18 is placed on the respective straightly extending portions of the two round belts 40, 54. The two round belts 40, 54 support respective lower surfaces of opposite end portions of the PWB 18 that are opposite to each other in the Y-axis direction, and cooperate with each other to convey the PWB 18. Therefore, when the PWB 18 is conveyed by the two round belts 40, 54, the PWB 18 is moved at an acceleration not greater than a maximum acceleration depending on gravitational acceleration. In the present embodiment, the two drive pulleys 32, 50 and the two driven pulleys 36, 52 provide four rotatable wheels; the two round belts 40, 54 provide two wound-on members; the drive pulley 32, the driven pulley 36, the round belt 40, and the drive device 64 cooperate with one another to provide a first under-positioned conveying unit 76; and the drive pulley 50, the driven pulley 52, the round belt 54, and the drive device 64 cooperate with one another to provide a second under-positioned conveying unit 78. The drive device 64 is commonly used by the two under-positioned conveying units 76, 78. In FIG. 2, the frame 30 is not shown for the purpose of showing the drive pulleys 32, 50, the driven pulleys 36, 52, and the round belts 40, 54.

As shown in FIG. 3, the frame 30 includes two PWB hold-down portions 80, 82 which project over the two support surfaces 42, 58, respectively, and which extend in the PWB-convey direction. In addition, the frame 30 supports a positioning and pressing device (not shown) which positions and supports, at the operation position on the horizontal plane, the PWB 18 conveyed to the operation area by the two under-positioned conveying units 76, 78, moves the PWB 18 upward off the two round belts 40, 54, and presses the PWB 18 against the two PWB hold-down portions 80, 82.

As shown in FIGS. 2 and 3, two flat belts 86, 88 each as a wound-on member are provided outside the respective straightly extending portions of the two round belts 40, 54, respectively. The two flat belts 86, 88 provide respective parts of two side-positioned conveying units 90, 92. Each of the flat belts 86, 88 is formed of a material, such as rubber, which has a friction coefficient of not smaller than 0.3 or not smaller than 0.4, and has an endless, annular shape. As shown in FIG. 2, the first flat belt 86 is wound on a drive pulley 94 and a driven pulley 96 each as a rotatable wheel that is rotatable about a vertical axis line, and has a straightly and horizontally extending portion which extends in the PWB-convey direction. Hereinafter, this portion of the flat belt 86 will be referred to as the "straightly extending portion" of the belt 86.

The drive pulley 94 is rotated by a drive device 98. Thus, the drive pulley 94 provides a drive rotatable wheel. The drive device 98 includes, as its drive source, a servomotor 100 whose rotation is transmitted to the drive pulley 94 by a rotation transmitting device 108 including two timing pulleys 102, 104 and a timing belt 106, so that the flat belt 86 is circulated.

As shown in FIG. 3, the flat belt 86 is engaged with a vertical contact surface 110 of the frame 30, and is slideable on the contact surface 110. The contact surface 110 is elongate in the PWB-convey direction, and is coated with a material, such as Teflon, which has a low friction coefficient. Thus, the contact surface 110 has a low friction coefficient. The contact surface 110 contacts one of opposite surfaces of the straightly extending portion of the flat belt 86 that is opposite to the other surface thereof at which the belt 86 contacts one of opposite side surfaces of the PWB 18 that are opposite to each other in the Y-axis direction, and the contact surface 110 supports the flat belt 86 on one of opposite sides of the belt 86 that is opposite to the other side thereof on which the PWB 18 is conveyed. A portion of the frame 30 that defines the contact surface 110 provides a support member.

Like the first flat belt 86, the second flat belt 88 is wound on a drive pulley 112 and a driven pulley 114 each as a rotatable wheel that is rotatable about a vertical axis line, and has a straightly and horizontally extending portion which extends in the PWB-convey direction. Hereinafter, this portion of the flat belt 88 will be referred to as the "straightly extending portion" of the belt 88. When the drive pulley 112 is rotated by a drive device 116, the second flat belt 88 is circulated. Thus, the drive pulley 112 provides a drive rotatable wheel. The drive device 116 includes, as its drive source, a servomotor 118 whose rotation is transmitted to the drive pulley 112 by a rotation transmitting device 126 including two timing pulleys 120, 122 and a timing belt 124. Thus, the two side-positioned conveying units 90, 92 are spaced from each other in the Y-axis direction parallel to the horizontal upper and lower surfaces of the PWB 18; and the respective straightly extending portions of the two flat belts 86, 88 are spaced from each other in the Y-axis direction and extend parallel to each other in the X-axis direction. As shown in FIG. 3, the straightly extending portion 88 of the second flat belt 88 is prevented by a stopper surface 128 of the frame 30 from being moved too far away from the first flat belt 86.

The straightly extending portion of the second flat belt 88 is biased toward the first flat belt 86 by a contact-force producing device 140 which includes a support member 142 and a plurality of press rollers 144 each as a freely rotatable wheel as a sort of freely rotatable member. As shown in FIG. 3, the support member 142 has a generally L-shaped cross section and, as shown in FIG. 2, the support member 142 is elongate parallel to the straightly extending portion of the flat belt 88. The support member 142 includes an upper horizontal portion which corresponds to the upper horizontal arm of the L-shaped cross section and which supports the press rollers 144 such that each of the press rollers 144 is rotatable about a vertical axis line perpendicular to the horizontal, X-axis and Y-axis directions and the rollers 144 are equidistant from each other, i.e., are arranged at a regular interval of distance in the X-axis direction. The flat belt 88 is engaged with the press rollers 144, such that the press rollers 144 contact one of opposite surfaces of the straightly extending portion of the flat belt 88 that is opposite to the other surface thereof at which the flat belt 88 contacts the other side surface of the PWB 18 that is opposite to the one side surface thereof which the flat belt 86 contacts. Each of the press rollers 144 has respective flanges 146 at its axially opposite end portions thereof, and the flat belt 88 is prevented from coming off the press rollers 144 because of the flanges 146 of the rollers 144.

The support member 142 additionally includes a vertical portion which corresponds to the vertical arm of the L-shaped cross section and which supports two upper brackets 148 (only one bracket 148 shown in FIG. 3), and two lower brackets 150 (only one bracket 150 is shown), at respective lengthwise opposite end portions of the member 142. Each of the two upper brackets 148 and a corresponding one of the two lower brackets 150 are vertically distant from each other, and the four projections 148, 150 project from the support member 142 in a direction away from the flat belt 88. The two upper brackets 148 have respective engaging projections 152 which project away from each other in the X-axis direction, and the two lower brackets 150 have respective engaging projections 154 which project away from each other in the X-axis direction. A pivotable member 156 is engaged with the engaging projections 152, 154 of the support member 142, such that the pivotable member 156 is pivotable relative to the support member 142. The pivotable member 156 is elongate parallel to the straightly extending portion of the flat belt 88, in the X-axis direction, and is fixed to an axis member 158 which is rotatably supported by the frame 30. Thus, the pivotable member 156 is pivotable about a horizontal axis line parallel to the X-axis direction and is not movable in an axial direction parallel to the horizontal axis line.

The pivotable member 156 has, at respective lengthwise opposite ends thereof, two upper brackets 160 and two lower brackets 162, such that each of the two upper brackets 160 and a corresponding one of the two lower brackets 162 are vertically distant from each other and the four brackets 160, 162 project toward the support member 142. The two upper brackets 160 have respective inclined elongate holes 164 which are inclined such that the elongate holes 164 extend upward as they extend away from the support member 142. The two lower brackets 162 have respective vertically elongate holes 164. The two upper engaging projections 152 are engaged with the two inclined elongate holes 164, respectively, and the two lower engaging projections 154 are engaged with the two lower vertical elongate holes 166, respectively, such that the upper projections 152 are movable relative to the upper holes 164 and the lower projections 154 are movable relative to the lower holes 166.

A plurality of compression coil springs 170 each as a sort of elastic member as a sort of biasing device are provided between the support member 142 and the pivotable member 156, and bias the support member 142 in a direction away from the pivotable member 156, that is, in a direction toward the first flat belt 86. Thus, the springs 170 are connected to the support member 142, so that the press rollers 144 receives, from the springs 170, a biasing force to bias the straightly extending portion of the second flat belt 88 toward the straightly extending portion of the first flat belt 86. The springs 170 are equidistant from each other, i.e., are arranged at a regular interval of distance, in the X-axis direction. The limit of movement of the support member 142 caused by the biasing force of the springs 170 is defined by the engagement of the engaging projections 152, 154 with the elongate holes 164, 166. Thus, the projections 152, 154 and the elongate holes 164, 166 cooperate with each other to provide a stopper device.

The pivotable member 156 is pivotally connected to a piston rod 182 of a pressurized-air-operated cylinder device 180 as a sort of pressurized-fluid-operated cylinder device as a sort of pressurized-fluid-operated actuator. The cylinder device 180 is a drive source. The air cylinder 180 is pivotally attached to the frame 30. When the piston rod 182 is extended, the pivotable member 156 is pivoted in a direction (clockwise in FIG. 3) away from the first flat belt 86, so that the support member 142 is moved together with the pivotable member 156 and the press rollers 144 are moved away from the first flat belt 86. The pivotable member 156 is pivoted to an angular position corresponding to a stroke end of the piston 182, so that the press rollers 144 are moved from an operative position thereof to an inoperative position thereof shown in FIG. 3. Even when the press rollers 144 are positioned at its inoperative position away from its operative position where the second flat belt 88 cooperates with the first flat belt 86 to sandwich the PWB 18, the second flat belt 88 is kept in engagement with the press rollers 144, but is moved off the PWB 18. In this state, the PWB 18 can also be moved off the first flat belt 86. In addition, in this state, the movement of the support member 142 caused by the biasing action of the springs 170 is limited by the above-described stopper device 152, 154, 164, 166.

When the piston rod 182 is retracted, the pivotable member 156 is pivoted toward the first flat belt 86 (i.e., counterclockwise in FIG. 3), and accordingly the support member 142 is moved toward the first flat belt 86. Consequently the second flat belt 88 is moved toward the first flat belt 86 to contact one side surface of the PWB 18 and press the same 18 against the first flat belt 86. In the state in which the two flat belts 86, 88 sandwich the PWB 18 in the Y-axis direction parallel to the upper and lower surfaces of the PWB 18, the support member 142 cannot be further moved, but the pivotable member 156 is further pivoted relative to the support member 142 while compressing the springs 170. Thus, the press rollers 144 press the second flat belt 88 because of the biasing force of the springs 170 and press the PWB 18 against the first flat belt 86. This pressing force is received by the contact surface 110 of the frame 30 that supports the first flat belt 86, and the reaction force is transmitted to the second flat, belt 88 via the PWB 18, so that the PWB 18 is sandwiched and held by the two flat belts 86, 88. The pivotable member 156 can be pivoted to an angular position corresponding to the other stroke end of the piston 182 of the air cylinder 180. Thus, the two flat belts 86, 88 are pressed against the PWB 18 with a force defined by the elastic force of the springs 170. The elastic force of the springs 170 is predetermined such that the sum of the contact force with which the first flat belt 86 contacts the PWB 18 and the contact force with which the second flat belt 88 contacts the PWB 18 takes such a value which assures that the PWB 18 does no fall off the two belts 86, 88 and simultaneously the two belts 86, 88 can convey the PWB 18 at an acceleration and a deceleration which are greater than a maximum acceleration and a maximum deceleration which can be achieved depending upon the weight of the PWB 18. In addition, the air cylinder 180 provides a moving device which moves the second flat belt 88 toward, and away from, the first flat belt 86.

As described above, the upper elongate holes 164 are inclined such that the holes 164 extend upward as they extend away from the support member 142, and the lower elongate holes 166 vertically extend. Therefore, when the pivotable member 156 is further pivoted relative to the support member 142 from the state in which the two flat belts 86, 88 have begun sandwiching the PWB 18, the support member 142 is moved upward, because of the effect of inclination of the upper elongate holes 164, while being guided by the lower elongate holes 166. Thus, the second flat belt 88 is moved upward while holding the PWB 18, and one widthwise end portion of the PWB 18 that is supported on the second round belt 54 is moved off the belt 54. Accordingly, the other widthwise end portion of the PWB 18 that is supported on the first round belt 40 is moved upward. However, the amount of upward movement of the other end portion of the PWB 18 is very small, so that the PWB 18 is just slightly moved off the first round belt 40.

The present EC mounting system is controlled by a control device 190 shown in FIG. 2. The control device 190 is essentially provided by a computer including a processing unit ("PU"), a read only memory ("ROM"), a random access memory ("RAM"), and a bus coupling those elements with one another, and controls the servomotors 66, 100, 118 and the air cylinder 180 of the under-positioned conveying units 76, 78 and the side-positioned conveying units 90, 92, in addition to the EC supplying device 10 and the EC mounting device 12.

Next, there will be described the operation of the EC mounting system constructed as described above.

The PWB 18 is carried in by the upstream-side device (not shown) onto the PWB conveyor 14 and, after the ECs are mounted on the PWB 18, the PWB 18 is carried out onto the downstream-side device (not shown). The carrying-in and carrying-out of the PWB 18 to and from the PWB conveyor 14 will be briefly described. The carring-in of a first PWB 18 from the upstream-side device onto the conveyor 14 and the carring-out of a third PWB 18 from the conveyor 14 onto the downstream-side device are performed by the two under-positioned conveying units 76, 78, while ECs are mounted on a second PWB 18 being positioned at the operation position on the conveyor 14. The conveying of the first PWB 18 from the operation-wait position to the operation position and the conveying of the second PWB 18 from the operation to the carry-out-wait position are performed by the two side-positioned conveying units 90, 92 after the ECs have been mounted on the second PWB 18.

In a normal operation state in which the ECs are mounted on the PWB 18, the PWB 18 is positioned on the horizontal plane by the positioning and pressing device (not shown), such that the PWB 18 is separate from the two round belts 40, 54, is pressed against the two hold-down portions 80, 82 of the frame 30, and is thereby fixed in position. The second flat belt 88 of the side-positioned conveying unit 92 is positioned at its inoperative position, so that the first flat belt 86 of the side-positioned conveying unit 90 may be separate from the PWB 18. The EC mounting head 20 of the EC mounting device 12 is moved to arbitrary positions on the horizontal plane to take ECs from the EC feeders 16 of the EC supplying device 10 and mount the ECs on predetermined EC-mount places on the PWB 18. Before the mounting of ECs is started, an image taking device (not shown) takes an image of a plurality of reference marks affixed to the PWB 18 positioned at the operation position, for example, takes an image of two reference marks located on a diagonal line of the PWB 18. The image taking device in addition to the EC mounting head 20 is provided on the X-Y robot 22 and is moved by the same 22 to take the image of the reference marks. Based on the taken image, the control device 190 calculates X-axis-direction and Y-axis- direction positional errors of each of the EC-mount places on the PWB 18, and corrects those positional errors when the EC mounting head 20 mounts an EC at the each EC-mount place on the PWB 18.

During the mounting of ECs on the second PWB 18, the third PWB 18 on which the ECs have been mounted and which is positioned at the carry-out-wait position is carried out onto the downstream-side device, and the first PWB 18 is carried in from the upstream-side device to the operation-wait position. These two operations may be concurrently performed, or alternatively the carrying-in of the first PWB 18 may be performed after the carrying-out of the third PWB 18. Since the second PWB 18 on which ECs are being mounted is separate from the two round belts 40, 54, the two under-positioned conveying units 76, 78 can carry in the first or new PWB 18 on which ECs are to be mounted, and carry out the third or completed PWB 18 on which the EC have been mounted, without stopping the mounting of ECs on the second PWB 18.

Here, it is assumed that the carrying-in of the first PWB 18 and the carrying-out of the third PWB 18 are concurrently performed. As indicated at two-dot chain line in FIG. 2, the third PWB 18 being positioned at the carry-out-wait position is placed on the two round belts 40, 54 of the two under-positioned conveying units 76, 78, and the second flat belt 88 of the second side-positioned conveying unit 92 is positioned at its inoperative position. When the servomotor 66 is operated or rotated, the two round belts 40, 54 are circulated in the PWB-convey direction indicated at Arrow "A", so that the first PWB 18 which has been conveyed by the PWB conveyor of the upstream-side device is transferred onto the two round belts 40, 54 and is conveyed to the operation-wait position, indicated at one-dot chain line, and so that the third PWB 18 being positioned at the carry-out-wait position is conveyed by the two round belts 40, 54 and is transferred onto the PWB conveyor of the downstream-side device. During this operation, the two servomotors 100, 118 of the two side-positioned conveying units 90, 92 are operated or rotated in synchronism with the rotation of the servomotor 66, so that the two flat belts 40, 54 are circulated in synchronism with the circulation of the round belts 40, 54, at the same speed as the speed of circulation of the round belts 40, 54, while the flat belts 86, 88 do not sandwich any PWBs 18. Thus, the two flat belts 86, 88 cooperate with each other to guide the movement of each PWB 18. Since the second flat belt 88 is kept separate from the second PWB 18 on which ECs are being mounted, and the first flat belt 86 can separate from the second PWB 18, the circulation of the two flat belts 86, 88 does not interfere with the mounting of ECs on the second PWB 18. Since the two round belts 40, 54 support the lower surface of each PWB 18, the each PWB 18 is conveyed at an acceleration and a deceleration which are not higher than a maximum acceleration and a maximum deceleration which can be achieved depending on the weight of the each PWB 18. Thus, those acceleration and deceleration may not be so high. However, the carrying-in of the first PWB 18 and the carrying-out of the third PWB 18 have only to be finished before the mounting of ECs on the second PWB 18 is finished. Thus, there is no problem. While the control device 190 controls the amount of conveying of each PWB 18 by the two under-positioned conveying units 76, 78, the first PWB 18 is carried in to the operation-wait position and the third PWB 18 is carried out from the carry-out-wait position.

After the mounting of ECs on the second PWB 18, the second PWB 18 is lowered by the positioning and pressing device, is supported on the two round belts 40, 54, and is released from the positioning and pressing device. From this state, the pivotable member 156 of the contact-force producing device 140 is pivoted toward the first flat belt 86, so that the press rollers 144 press the second flat belt 88 against the first and second PWBs 18 and press the PWBs 18 against the first flat belt 86. Thus, the PWBs 18 are sandwiched and held between the two flat belts 86, 88 in the Y-axis direction parallel to the upper and lower surfaces of each PWB 18.

Thus, the two flat belts 86, 88 sandwich and hold the first and second PWBs 18 being positioned at the operation-wait position and the operation position, respectively. The two flat belts 86, 88 contact each PWB 18 with a contact force which can assure that the each PWB 18 does no fall of the belts 86, 88 and is conveyed at an acceleration and a deceleration which is greater than a maximum acceleration and a maximum deceleration which can be achieved depending on the weight of the each PWB 18. In addition, the two flat belts 86, 88 lift the PWBs 18 up off the two round belts 40, 54. Subsequently, the two servomotors 100, 118 are operated in synchronism with each other to circulate the two flat belts 86, 88 at the same speed and thereby quickly convey the first and second PWBs 18 from the operation-wait and operation positions to the operation and carry-out-wait positions, respectively. During this operation, the two round belts 40, 54 are kept stopped. However, the one widthwise end portion of each PWB 18 that corresponds to the first round belt 40 is slightly spaced from the belt 40 so that the one end portion contacts the belt 40 with a very small contact load, and the other widthwise end portion of the each PWB 18 that corresponds to the second round belt 54 is sufficiently spaced from the belt 54. Thus, the first and second PWBs 18 can be smoothly conveyed without being interfered with by the round belts 40, 54. The control device 190 controls the amount of conveying of PWBs 18 by the two side-positioned conveying units 90, 92, so as to stop the first PWB 18 at the operation position.

Then, the pivotable member 156 is pivoted away from the first flat belt 86, so that the press rollers 144 are moved away from the first and second PWBs 18 being positioned at the operation and carry-out-wait positions, respectively, and the two PWBs 18 are released from the two flat belts 86, 88. Subsequently, the first PWB 18 is positioned on the horizontal plane, is vertically elevated, and is pressed against the two hold-down portions 80, 82, by the positioning and pressing device. In this state, ECs are mounted on the first PWB 18.

In this way, the first and second PWBs 18 are quickly conveyed from the operation-wait and operation positions to the operation and carry-out-wait positions, respectively, and accordingly the second PWB 18 on which the ECs have been mounted is replaced, in a short time, with the first PWB 18 on which ECs are to be mounted. Thus, the efficiency of mounting of ECs on PWBs 18 is improved. For example, in the case where two under-positioned PWB conveyors are provided such that the two conveyors extend parallel to each other, it is possible that while ECs are mounted on a first PWB which has been carried in by one of the two conveyors, a second PWB on which ECs have been mounted may be carried out from the other conveyor and a third PWB on which ECs are to be mounted may be carried in onto the other conveyor so that the third PWB waits for the mounting of ECs. In this case, it is possible to start, immediately after the completion of mounting of ECs on the first PWB, mounting ECs on the third PWB. In this case, however, the two under-positioned PWB conveyors are employed, which leads to lowering the cost performance and increasing the space occupied by the conveyors. In contrast, the present PWB conveyor 14 can quickly convey each PWB 18 and quickly replace the PWB 18 on which the ECs have been mounted, with the PWB 18 on which ECs are to be mounted. Thus, the present conveyor 14 can improve the efficiency of mounting of ECs on PWBs 18, without lowering the cost performance and increasing the occupied space.

In the first embodiment shown in FIGS. 1 to 3, the contact-force producing device 140 includes the press rollers 144 which press the second flat belt 88 against one side surface of each PWB 18 and thereby lift the each PWB 18 up off the two round belts 40, 54. However, it is not essentially required to have each PWB 18 spaced from the two round belts 40, 54, for example, as shown in FIG. 4.

Figure 4:
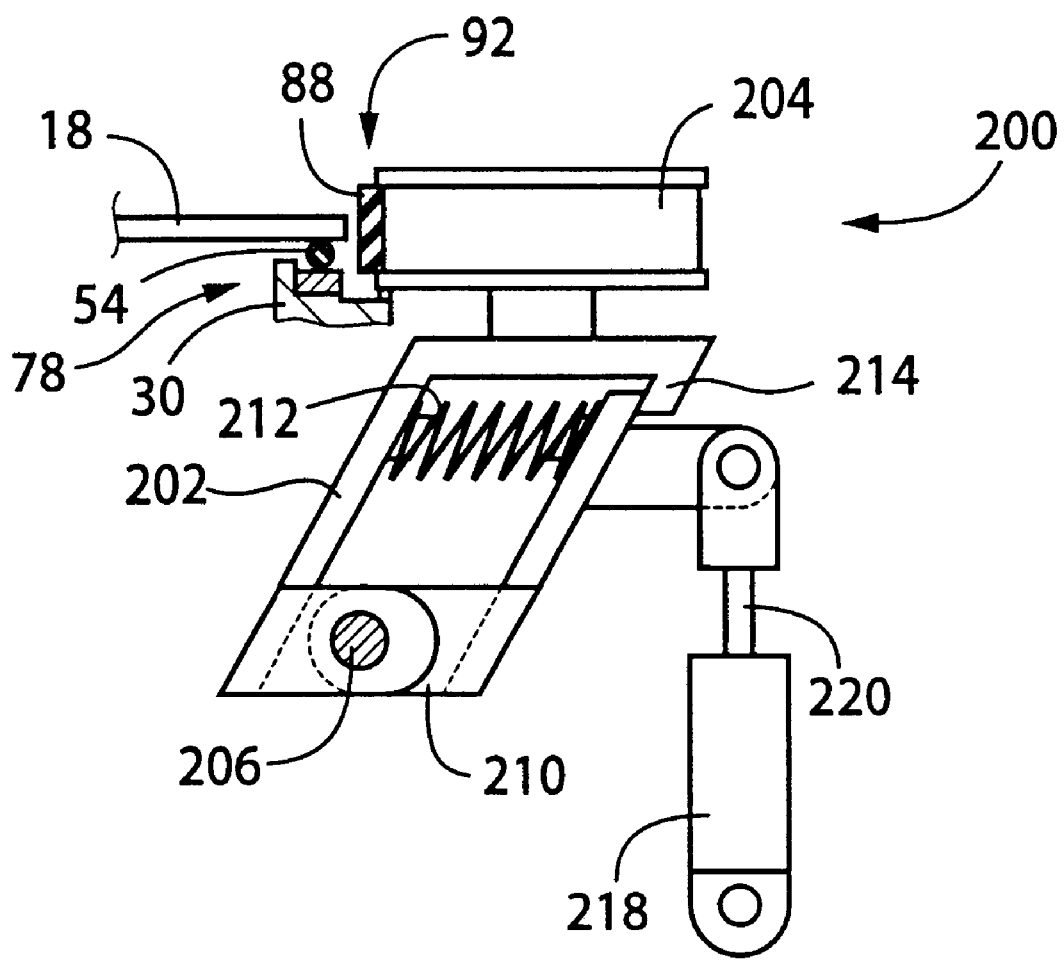
FIG. 4 is a partly cross-sectioned, side elevation view of a contact-force producing device of another PWB conveyor as a second embodiment of the present invention.

FIG. 4 shows another contact-force producing device 200 which can be employed in place of the contact-force producing device 140 in the PWB conveyor 14 shown in FIG. 1. The producing device 200 includes an elongate support member 202, and a plurality of press rollers 204 supported by the supper member 202. The support member 202 is supported by the frame 39 via an axis member 206, such that the member 202 is pivotable about a horizontal axis line parallel to the straightly extending portion of the second flat belt 88, i.e., parallel to the X-axis direction. The plurality of press rollers 204 are supported by the support member 202, such that the rollers 204 are equidistant from one another, i.e., are arranged at a regular interval of distance along a straight line parallel to the straightly extending portion of the second flat belt 88 and each of the rollers 204 is freely rotatable about a vertical axis line. In addition, a pivotable member 210 as a movable member is pivotally supported by the axis member 206, and the support member 202 is biased in a direction away from the pivotable member 210, by a plurality of compression coil springs 212 each as an elastic member as a sort of biasing device that is provided between the support member 202 and the pivotable member 210. A limit of movement of the support member 202 caused by the biasing action of the springs 212 is defined by engagement of an engaging portion 214 of the support member 210 with the pivotable member 210. Thus, the engaging portion 214 cooperates with a portion of the pivotable member 210 which the engaging portion 214 engages to provide a stopper device.

The pivotable member 210 is pivotally connected to a piston rod 220 of a pressurized-air-operated cylinder device 218 which is pivotally connected to the frame 30. When the piston rod 220 is retracted, the pivotable member 210 is pivoted in a direction away from the first flat belt 86 (not shown in FIG. 4), and the support member 202 is pivoted to follow the pivotable member 210, so that the second flat belt 88 is moved to its inoperative position where the belt 88 does not contact the PWB 18. When the piston rod 220 is extended, the pivotable member 210 is pivoted in a direction toward the first flat belt 86. The support member 202 is pivoted with the pivotable member 210 till the second flat belt 88 contacts the PWB 18 and cooperates with the first flat belt 86 to sandwich the PWB 18. After the two flat belts 86, 88 grasped the PWB 18, the support member 202 is no further moved, but the pivotable member 210 is further pivoted relative to the support member 202 while compressing the springs 212, so that the press rollers 204 press the second flat belt 88 and the two flat belts 86, 88 sandwich and hold the PWB 18 with the contact force corresponding to the biasing force of the springs 212. Thus, the air cylinder 218 provides a moving device which moves the second flat belt 88 toward, and away from, the first flat belt 86. The frame 30 is so formed as not to interfere with the support member 202 when the member 202 is pivoted. In the present embodiment, the respective drive devices of the two under-positioned conveying units 76, 78 and the two side-positioned conveying units 90, 92 share a single drive source in the form of a servomotor which is not shown in FIG. 4, and accordingly the two round belts 40, 54 and the two flat belts 86, 88 are always circulated at the same speed in synchronism with one another. The same reference numerals as used in the first embodiment shown in FIGS. 1 to 3 are used to designate the corresponding elements and parts of the second embodiment shown in FIG. 4, and the description thereof is omitted.

When a PWB 18 is carried in from the upstreamside device to the operation-wait position and another PWB 18 is carried out from the carry-out-wait position to the downstream-side device, the second flat belt 88 is positioned at its inoperative position and accordingly the two PWBs 18 are carried in and carried out by the two under-positioned conveying units 76, 78. Since the four conveying units 76, 78, 90, 92 share the common drive source, the two flat belts 86, 88 are circulated at the same speed as that at which the two round belts 40, 54 are circulated, and guide the movement of each PWB 18. When each PWB 18 is conveyed from the operation-wait position to the operation position and from the operation position to the carry-out-wait position, the two flat belts 86, 88 laterally sandwich the each PWB 18 and quickly convey. The two flat belts 86, 88 convey each PWB 18 in the state in which the each PWB 18 is placed on the two round belts 40, 54. Since the round belts 40, 54 are circulated in synchronism with the flat belts 86, 88 by the common drive source, the round belts 40, 54 do not interfere with the movement of each PWB 18 caused by the flat belts 86, 88.

Figure 5:
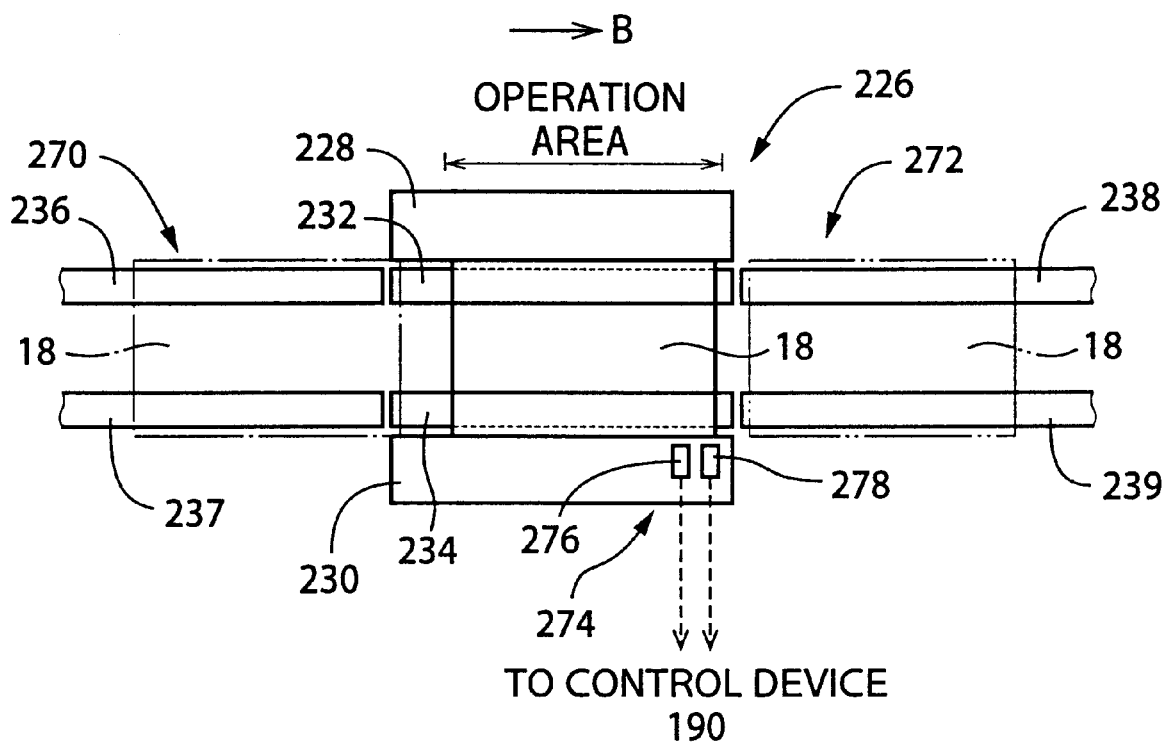
FIG. 5 is a schematic plan view of another PWB conveyor as a third embodiment of the present invention.
Figure 6:
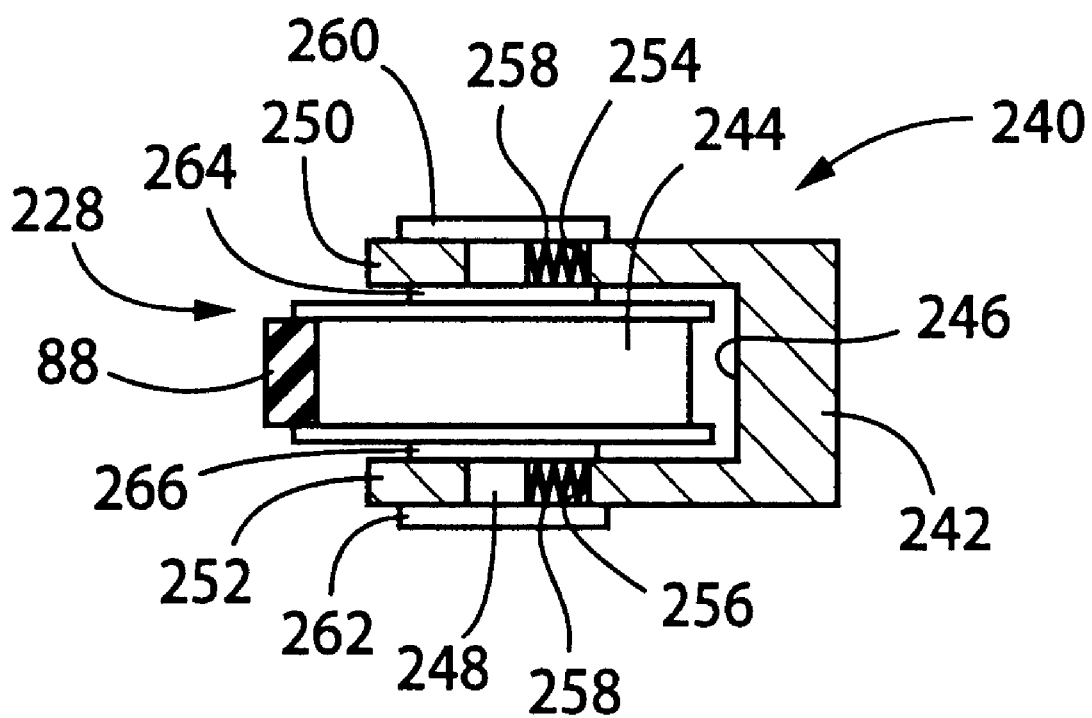
FIG. 6 is a partly cross-sectioned, side elevation view of a contact-force producing device of the PWB conveyor of FIG. 5.
Figure 7:
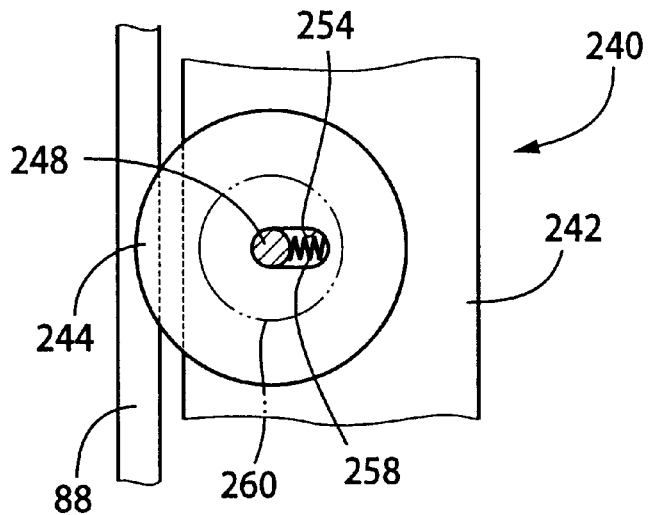
FIG. 7 is a schematic plan view of the contact-force producing device of the PWB conveyor of FIG. 5.

In each of the first and second embodiments, the springs 170, 212 as part of the biasing device are connected to the support member 202 which supports the press rollers 144, 204 each as a freely rotatable member. However, it is possible that a freely rotatable member be provided on a support member such that the freely rotatable member is movable relative to the support member and a biasing device be provided between the freely movable member and the support member. In addition, it is possible to omit the moving device which moves one of the two flat belts 86, 88 toward, and away from, the other flat belt. FIGS. 5 to 7 shows a third embodiment which employs those features.

The third embodiment relates to a PWB conveyor 226 which includes two side-positioned conveying units 228, 230 and two under-positioned conveying units 232, 234 similar to the two side-positioned conveying units 90, 92 and the two under-positioned conveying units 76, 78 shown in FIGS. 1 to 4. The same reference numerals as used in the first and second embodiments shown in FIGS. 1 to 4 are used to designate the corresponding elements and parts of the third embodiment shown in FIGS. 5–7, and the description thereof is omitted. In the third embodiment, however, the four units 228, 230, 232, 234 are somewhat longer than the operation area in which just one PWB 18 can be accommodated, in a PWB-convey direction, indicated at Arrow "B". In addition, two upstream-side conveying units 236, 237 are provided on an upstream side of, and adjacent to, the PWB conveyor 226 as seen in the PWB-convey direction, and two downstreamside conveying units 238, 239 are provided on a downstream side of, and adjacent to, the PWB conveyor 226 in the PWB-convey direction. The two upstream-side conveying units 236, 237 cooperate with each other to provide an upstream-side PWB conveyor 270, and the two downstream-side conveying units 238, 239 cooperate with each other to provide a downstream-side PWB conveyor 272. Each of the four conveying units 236–239 has a construction identical with that of each of the under-positioned conveying units 232, 234, and accordingly includes a round belt and conveys the PWB 18 while supporting the lower surface of the PWB 18. The respective drive devices of the two side-positioned conveying units 228, 230 and the two under-positioned conveying units 232, 234 employ a common drive source, and the two upstream-side conveying units 236, 237 and the two downstream-side conveying units 238, 239 employ respective servomotors as respective exclusive drive sources thereof.

A PWB detecting device 274 is provided to detect the PWB 18 which is conveyed by the side-positioned conveying units 228, 230, and thereby stop the PWB 18 at an EC-mount position located in the operation area. The PWB detecting device 274 includes a first and a second PWB sensor 276, 278 which are provided at different positions in the PWB-convey direction. In the present embodiment, each of the two PWB sensors 276, 278 is provided by a reflection-type photoelectric sensor as a sort of non-contact-type sensor. Each sensor 276, 278 produces a first signal when a light receiver thereof receives a light emitted by a light emitter thereof and reflected by a PWB 18, and a second signal different from the first signal when the light receiver does not receive the light emitted by the light emitter, that is, when no PWB 18 is present. The respective signals produced by the two PWB sensors 276, 278 are supplied to the control device 190 which controls the PWB conveyor 226, so that when the upstream, first PWB sensor 276 detects a PWB 18, the two side-positioned conveying units 228, 230 decrease the speed at which the units 228, 230 convey the PWB 18 and, when the downstream, second PWB sensor 278 detects the PWB 18, the units 228, 230 stop conveying the PWB 18.

As shown in FIGS. 6 and 7, the present PWB conveyor 226 employs a contact-force producing device 240 which includes an elongate support member 242 which extends parallel to the straightly extending portion of the flat belt 88 of the side-positioned conveying unit 228 and which supports a plurality of press rollers 244. The support member 242 has an elongate groove 246 which extends parallel to the straightly extending portion of the flat belt 88 and opens toward the flat belt 88, and in which the press rollers 244 are provided such that each of the press rollers 244 is rotatable about an axis member 248 thereof and is movable in the Y-axis direction perpendicular to the PWB-convey direction.

Axially opposite end portions of the axis member 248 of each press roller 244 project axially outward from axially opposite ends of the roller 244, respectively, and are fitted in respective elongate holes 254, 256 formed through two side walls 250, 252 of the support member 242 that define the elongate groove 246, such that each of the two end portions of the axis member 248 is movable, and rotatable, relative to a corresponding one of the two elongate holes 254, 256. Thus, each of the press rollers 244 is rotatable about a vertical axis line perpendicular to the X-axis direction in which the respective straightly extending portions of the two flat belts 86, 88 (the flat belt 86 is not shown) of the two side-positioned conveying units 228, 230 and to the Y-axis direction in which the two straightly extending portions are spaced from each other. In the present embodiment, the press rollers 244 are equidistant from one another in the X-axis direction on the support member 242.

Each of the elongate holes 254, 256 extends in the horizontal, Y-axis direction perpendicular to the X-axis direction in which the straightly extending portion of the flat belt 88 extends. The press rollers 244 are supported by the support member 242 such that each of the rollers 244 is movable in the Y-axis direction. A compression coil spring 258 as an elastic member as a sort of biasing device that is provided in each of the elongate holes 254, 256, biases the press roller 244 in a direction toward the straightly extending portion of the flat belt 88. The limit of movement relative to the support member 242 of each press roller 244 caused by the biasing force of the corresponding spring 258, is defined by butting of the axis member 248 of the each roller 244 against an end wall surface of the corresponding elongate hole 254, 256. Thus, the axis member 248 and the elongate holes 254, 256 cooperate with each other to provide a stopper device which stops the movement of each press roller 244 relative to the support member 242.

The contact-force producing device 240 does not include a moving device which moves the one flat belt 88 of the one side-positioned conveying unit 228 toward, and away from, the other flat belt 86 of the other side-positioned conveying unit 230. The support member 242 is a stationary member which is fixed in position. The press rollers 244 and the elongate holes 254, 256 are designed such that a portion of an outer peripheral portion of each press roller 244 projects toward the flat belt 88 out of the groove 246 of the support member 242 and contacts the flat belt 88, irrespective of whichever position the each roller 244 may take between a projected position thereof where the movement of the each roller 244 is limited or stopped by the above-indicated stopper device, that is, the each roller 244 is projected toward the PWB 18 by a maximum amount, and a retracted position where the each roller 244 is retracted from the PWB 18 into the groove 246, and such that in the state in which the press rollers 244 are positioned at their projected positions, the distance between the two flat belts 86, 88 should be somewhat smaller than the dimension of each PWB 18 as measured in the Y-axis direction. Two plate members 260, 262 are fixed to the axially opposite ends of the axis member 248 of each press roller 244, respectively, such that the two plate members 260, 262 are engaged with upper and lower surfaces of the support member 242, respectively, and two plate members 264, 266 are inserted between the axially opposite ends of the each roller 244 and the two side walls 250, 252 of the support member 242, respectively. The four plate members 260, 262, 264, 266 cooperate with one another to prevent the axis member 248 of each press roller 244 from tilting relative to a vertical direction.

In the present embodiment, each PWB 18 is sandwiched, in the operation area, by the respective flat belts 86, 88 of the two side-positioned conveying units 228, 230, in the Y-axis direction parallel to the upper and lower major surfaces of the each PWB 18, while the lower surface of the each PWB 18 is supported on the respective round belts 40, 54 of the two under-positioned conveying units 232, 234. In this state, ECs are mounted on the each PWB 18. The upstream-side PWB conveyor 270 receives each PWB 18 from an upstream-side device (not shown), and places the each PWB 18 in a state in which the two side-positioned conveying units 228, 230 can convey the each PWB 18. Since the control device 190 controls the two upstream-side conveying units 236, 237 such that the respective drive sources thereof are operated in synchronism with each other, the respective round belts of the units 236, 237 are circulated at the same speed. Thus, the downstream-side PWB conveyor 270 conveys the PWB 18 till the downstream-side end portion of the PWB 18 is caught by the respective upstream-side end portions of the two flat belts 86, 88 of the two side-positioned conveying units 228, 230, as indicated at one-dot chain line in FIG. 5, and the PWB 18 is thus placed in the state in which the two side-positioned conveying units 228, 230 can start conveying the PWB 18. In this state, the PWB 18 waits for being conveyed to the operation area. During this operation, the two side-positioned conveying units 228, 230 and the two under-positioned conveying units 232, 234 are kept stopped, and accordingly ECs can be mounted on the PWB 18 sandwiched by the two flat belts 86, 88, without causing any problems.

The PWB 18 on which the ECs have been mounted is carried out from the PWB conveyor 226 onto the downstream-side PWB conveyor 272, and the waiting PWB 18 on which ECs are to be mounted is conveyed to the operation area on the PWB conveyor 226. To this end, the respective flat belts 86, 88 of the two side-positioned conveying units 228, 230 and the respective round belts 40, 54 of the two under-positioned conveying units 232, 234 are circulated in synchronism with one another. As described above, the press rollers 244 of the contact-force producing device 240 is designed such that in the state in which the press rollers 244 are positioned at their projected positions, the distance between the two flat belts 86, 88 is somewhat shorter than the width of each PWB 18 as measured in the Y-axis direction. Therefore, the PWB 18 which is positioned at the operation position is sandwiched by the two flat belts 86, 88 in the state in which the press rollers 244 are somewhat retracted from their projected positions toward their retracted positions against the biasing forces of the springs 258. Thus, owing to the biasing action of the springs 258, the PWB 18 is quickly carried out to the downstream-side PWB conveyor 272, at an acceleration and a deceleration which are higher than a maximum acceleration and a maximum deceleration which can be achieved depending on the own weight of the PWB 18.

Concurrently with the carrying-out of the current PCB 18, the next PWB 18 which is placed on the respective round belts of the two upstream-side conveying units 236, 237 and is caught by the upstream-side end portions of the respective flat belts 86, 88 of the two side-positioned conveying units 228, 230, is moved into the space left between the two flat belts 86, 88 because of the circulation of the belts 86, 88, so that the PWB 18 is sandwiched by the belts 86, 88. Owing to the biasing action of the springs 258, the PWB 18 is quickly carried in to the operation area at high acceleration and deceleration.

When the downstream-side end of the PWB 18 is detected by the first PWB sensor 276, the speed at which the PWB 18 is conveyed is decreased; and when the end of the PWB 18 is detected by the second PWB sensor 278, the conveying of the PWB 18 is stopped, so that the PWB 18 is positioned at the EC-mount position in the operation area. Subsequently, before the mounting of ECs, the reference marks affixed to the PWB 18 are imaged by the image taking device (not shown) and, based on the taken image of the reference marks, X-axis-direction and Y-axis-direction positional errors of each of the prescribed EC-mount places on the PWB 18 are determined by the control device 190. Those positional errors of each EC-mount place are corrected when an EC is mounted at the each EC-mount place. When each PWB 18 is carried in or carried out, the two round belts 40, 54 are circulated at the same speed as that at which the two flat belts 86, 88 are circulated. Thus, the round belts 40, 54 do not interfere with the movement of each PWB 18. In addition, since the round belts 40, 54 support the lower surface of each PWB 18, the belts 40, 54 can prevent the each PWB 18 from falling off the flat belts 86, 88.

When each PWB 18 is carried in or carried out, the two upstream-side conveying units 236, 237 and the two downstream-side conveying units 238, 239 may, or may not, be operated. Since the downstream-side end of the PWB 18 to be carried in to the operation area is held by the upstream-side end portions of the respective flat belts 86, 88 of the two side-positioned conveying units 228, 230, the PWB 18 can be conveyed by the two units 228, 230, without having to circulate the round belts of the upstream-side conveying units 236, 237. In addition, the PWB 18 positioned in the operation area can be carried out, as indicated at two-dot chain line in FIG. 5, by the two side-positioned conveying units 228, 230 to the two downstream-side conveying units 238, 239. The units 238, 239 carry out the PWB 18 to the downstream-side device. To this end, the respective drive sources of the two units 238, 239 are operated in synchronism with each other, so that the two round belts of the units 238, 239 are circulated at the same speed. However, it can be considered that the upstream-side PWB conveyor 270 is part of the upstream-side device and likewise the downstream-side PWB conveyor 272 is part of the downstream-side device.

In the third embodiment shown in FIGS. 5 to 7, the respective drive devices of the two side-positioned conveying units 228, 230 and the two under-positioned conveying units 232, 234 may employ respective exclusive drive sources. In this case, the control device 190 controls those exclusive drive sources such that they are operated in synchronism with one another. In addition, the respective drive devices of the two upstream-side and/or downstream-side conveying units 236, 237 and/or 238, 239 may employ respective exclusive drive sources.

The PWB detecting device 274 may employ only one of the two PWB sensors 276, 278. In this case, when each PWB 18 is carried in to the operation area, the PWB 18 is detected by the single PWB sensor, so that the control device 190 controls the two side-positioned conveying units 228, 230 to stop conveying the PWB 18.

Figure 8:
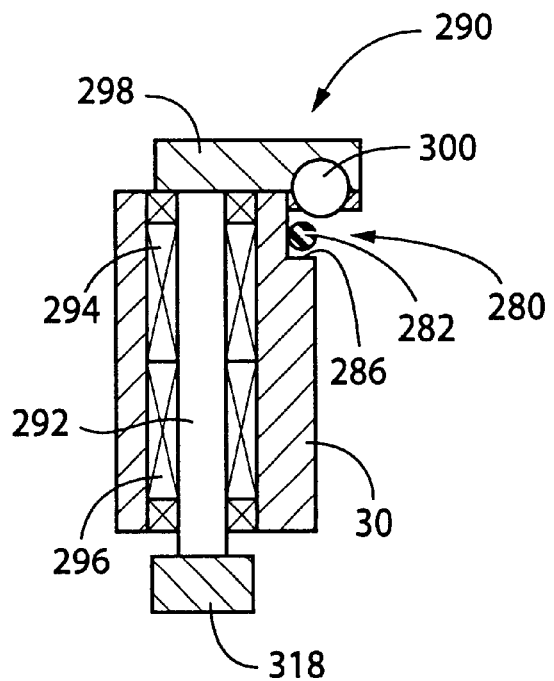
FIG. 8 is a cross-sectioned, side elevation view of a contact-force producing device of another PWB conveyor as a fourth embodiment of the present invention.
Figure 9:
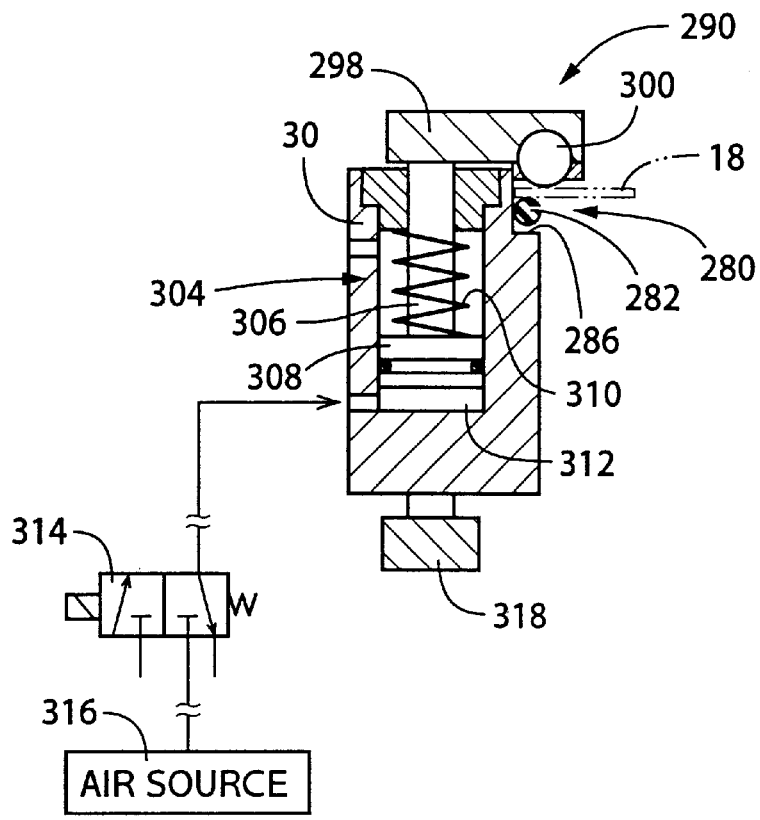
FIG. 9 is another cross-sectioned, side elevation view of the contact-force producing device of FIG. 8.
Figure 10:
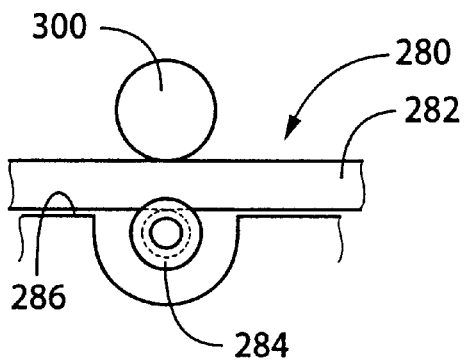
FIG. 10 is a front elevation view of a ball member of the contact-force producing device of FIG. 8, a guide roller, and a round belt.

Each PWB 18 may be conveyed while only the lower surface of the PWB 18 is supported, as shown in FIGS. 8 to 10. FIGS. 8 to 10 shows a PWB conveyor as a fourth embodiment of the present invention. The same reference numerals as used in the first and third embodiments shown in FIGS. 1 to 3 and FIGS. 5 to 7 are used to designate the corresponding elements and parts of the fourth embodiment and the description thereof is omitted.

The present PWB conveyor includes two conveying units 280 (only one unit 280 is shown in the figures). Here, it is assumed that the two conveying units 280 extend over an operation-wait area, an operation area, and a carry-out-wait area, like the two under-positioned conveying units 76, 78 employed in the first embodiment shown in FIGS. 1 to 3. Each of the two conveying units 280 has a construction similar to that of each of the two conveying units 76, 78, and includes a round belt 282, and a drive pulley, a driven pulley and a drive device (all not shown). The round belt 282 is wound on the drive and driven pulleys and, as shown in FIG. 10, is wound on a plurality of guide rollers 284 (only one roller 284 is shown in FIG. 10) and a horizontal support surface 286 which are provided on the frame 30. Thus, each of the two round belts 282 has a straightly extending portion which horizontally and straightly extends between the drive and driven pulleys. The guide rollers 284 are supported by the frame 30 such that each of the rollers 284 is rotatable about a horizontal axis line perpendicular to the straightly extending portion of the round belt 282 and such that the rollers 284 are equidistant from one other in the PWB-convey direction. The level of the support surface 286 is somewhat lower, as shown in FIG. 10, than the level at which the respective upper ends of the guide rollers 284 support the round belt 282. The support surface 286 is coated with Teflon so as to have a low friction coefficient, and cooperates with the guide rollers 284 to support the lower end portion of the round belt 282 but does not resist the movement of the belt 282.

The PWB 18 is placed on the respective round belts 282 of the two conveying units 280, and is conveyed while the lower surface of the PWB 18 is supported on the two round belts 282. The present PWB conveyor additionally includes two contact-force producing devices 290 (only one device 290 is shown in FIG. 9) which press the PWB 18 against the two round belts 282. The frame 30 has two holes at two locations distant from each other in the X-axis direction parallel to the PWB-convey direction along the straightly extending portion of each of the two round belts 282. Thus, the frame 30 has four holes in total for the two producing devices 290. Four guide rods 292 are fitted in the four holes, respectively, each via an upper and a lower bearing 294, 296, such that each of the guide rods 292 is vertically movable. The two bearings 294, 296 are rolling-sliding bearings.

Respective upper ends of the two guide rods 292 of each contact-force producing device 290 can project upward out of the upper surface of the frame 30, over the upper end portion of the corresponding round belt 282, and an elongate support member 298 is fixed, at its lengthwise opposite end portions, to the respective upper ends of the two guide rods 292. Each of the two support member 298 supports, above the corresponding round belt 282, a plurality of ball members 300 each as a freely rotatable member, such that each of the ball members 300 is rotatable about a substantially horizontal axis line perpendicular to the PWB-convey direction and is prevented from falling off the member 298. However, since each ball member 300 has a spherical shape, it is rotatable about an arbitrary axis line. The ball members 300 are supported by each support member 298 such that the balls 300 are equidistant from each other in the PWB-convey direction and such that a lower end portion of each ball 300 projects downward over a small distance from a lower surface of the support member 298 that faces the round belt 282. Respective lower ends of the two guide rods 292 of each producing device 290 project downward from the frame 30, and are connected to each other by a plate-like connection member 318 which is elongate in the PWB-convey direction. Thus, the two guide rods 318 are vertically moved as an integral unit.

As shown in FIG. 9, the frame 30 additionally supports a pressurized-air-operated cylinder device 304 in the vicinity of each of the four guide rods 292. The air cylinder 304 provides a moving device which moves the ball members 300 toward, and away from, the PWB 18. The air cylinder 304 is a single-action-type cylinder device, and a piston rod 306 thereof is fixed to the corresponding support member 298. A piston 308 of the air cylinder 304 is biased by a compression coil spring 310 as an elastic member as a sort of biasing device, in a direction in which the support member 298 approaches the PWB 18 or the corresponding round belt 298. The limit of movement of the support member 298 caused by the biasing action of the spring 310 is defined by butting of the support member 298 on the upper surface of the frame 30. Thus, the frame 30 provides a stopper device. In a state in which each of the two support members 298 is held in contact with the upper surface of the frame 30, the respective lower end points of the ball members 300 and the upper end line of the corresponding round belt 282 are located on a common, substantially horizontal plane.

Each of the four air cylinders 304 has, under the piston 308, an air chamber 312 which is selectively communicated, by a solenoid-operated direction switch valve 314 as a solenoid-operated control valve, with an air source 316 and the atmosphere. When pressurized air is supplied from the air source to the air chamber 312 of each of the four air cylinders 304, the corresponding piston 308 is moved upward against the biasing force of the corresponding spring 310, so that the corresponding support member 298 is moved away from the corresponding round belt 282. The limit of movement of each support member 298 away from the corresponding round belt 282 is defined by butting of the corresponding connection member 318 on the lower surface of the frame 30.

When the PWB 18 is placed on the two round belts 282, the two support members 298 are moved away from the respective straightly extending portions of the two round belts 282 by the four air cylinders 304. More specifically described, the air chambers 316 of the four air cylinders 304 are communicated with the air source 316 and the four pistons 308 are moved upward, so as to create, between each of the ball members 300 and each of the round belts 282, a space which allows the PWB 18 to move thereinto. In the present embodiment, this space is greater than the thickness of each PWB 18. Thus, when the PWB 18 is carried in to the operation-wait area, all the ball members 300 are kept spaced apart from the two round belts 282, so that the PWB can enter the spaces created between the ball members 300 and the round belts 282. After the PWB 18 is thus placed on the round belts 282, the ball members 300 are kept spaced from the round belts 282, and the round belts 282 are circulated to convey the PWB 18 at an acceleration not higher than a maximum acceleration depending on gravitational acceleration. While one PWB 18 is carried in to the operation-wait area, another PWB 18 is concurrently carried out from the carry-out-wait area.

When the PWB 18 is conveyed from the operation wait area to the operation area, the ball members 300 are caused to contact the upper surface of the PWB 18 whose lower surface is supported on the respective straightly extending portions of the two round belts 282. The solenoid valve 314 is switched to communicate the respective air chambers 312 of the four air cylinders 304 with the atmosphere, so that the respective pistons of the four air cylinders 304 are lowered by the respective biasing actions of the springs 310 and accordingly the two support members 298 are lowered to approach the frame 30. Thus, the ball members 300 contact the upper surface of the PWB 18, with a force corresponding to the respective elastic forces of the springs 310. That is, the PWB 18 is caused to contact the round belts 282 with a contact force which is equal to the weight of the PWB 18 itself and the force corresponding to the elastic forces of the springs 310. Therefore, the PWB 18 is quickly moved at an acceleration higher than a maximum acceleration depending upon gravitational acceleration.

The PWB 18 is stopped at the operation position, based on the control of amount of conveying of the PWB 18 caused by the circulation of the round belts 282, or the detection of the PWB 18 by the PWB detecting device 274. After the stopping of the PWB 18, the pressurized air is supplied to the air chambers 312 of the four air cylinders 304, so that the two support members 298 are elevated till the connection member 318 contacts the frame 30 and accordingly the ball members 300 are moved away from the PWB 18 (or the round belts 28). From this state, the PWB 18 is positioned and elevated by the positioning and pressing device (not shown) provided in the operation area, so that the PWB 18 is lifted up off the round belts 282 and is pressed against the ball members 300. In this state, the reference marks affixed to the PWB 18 are imaged by the image taking device (not shown) and, based on the taken image, the ECs are mounted on the PWB 18. Thus, the ball members 300 also function as hold-down members which hold down the PWB 18. After the mounting of ECs, the PWB 18 is lowered and again placed on the two round belts 282, and the ball members 300 are caused to contact the PWB 18 and quickly convey the PWB 18 from the operation area to the carry-out-wait area. The conveying of the current PWB 18 on which the ECs have been mounted is quickly performed concurrently with the conveying of the next PWB 18 on which ECs are to be mounted is performed. Since ECs are mounted on a second PWB 18 in the state in which the second PWB 18 is lifted up off the round belts 282, the carrying-in of a first PWB 18 to the operation-wait area and the carrying-out of a third PWB 18 from the carry-out-wait area can be performed concurrently with the mounting of ECs on the second PWB 18.

In the fourth embodiment shown in FIGS. 8 to 10, it is possible to concurrently perform the conveying of a first PWB 18 from the operation-wait area to the operation area, the conveying of a second PWB 18 from the operation area to the carry-out-wait area, and the carrying-out of a third PWB 18 from the carry-out-wait area to the downstream-side device (not shown).

In the fourth embodiment, it is not essentially required that the two conveying units 280 be so provided as to extend over the operation-wait area, the operation area, and the carry-out-wait area, and it is possible that the conveying units 280 be so provided as to extend over an area shorter than those three areas.

Anyhow, when the PWB 18 is conveyed by the two conveying units 280, the PWB 18 is placed on the two round belts 282, in the state in which the ball members 300 are kept away from the round belts 282. If the PWB 18 is conveyed at an acceleration higher than a maximum acceleration depending on gravitational acceleration, the ball members 300 are caused to contact the PWB 18 so that the springs 310 bias the PWB 18; and if the PWB 18 is conveyed at an acceleration not higher than the maximum acceleration depending on gravitational acceleration, the ball members 300 are kept away from the round belts 282.

In each of the first to fourth embodiments shown in FIGS. 1 to 10, the PWB 18 is conveyed either in the first state in which the PWB 18 is sandwiched in the horizontal, Y-axis direction parallel to the upper and lower major surfaces of he PWB 18, or in the second state in which the lower major surface of the PWB 18 is supported on the round belts 40, 54, 282. However, it is possible that the PWB be conveyed only in the first state. For example, in each of the first and third embodiments shown in FIGS. 1 to 7, the under-positioned conveying units 76, 78, 232, 234 are omitted, and only the side-positioned conveying units 90, 92, 228, 230 are employed. In this case, however, at least one support member is employed which supports the lower surface of the PWB 18 when the respective wound-on members (e.g., flat belts) of the two side-positioned conveying units sandwich, or release, the PWB 18. This support member is provided between the two side-positioned conveying units, and may be one which contacts the PWB 18 when the two wound-on members grasp or release the PWB 18 but otherwise is kept away from the PWB 18, or one which is always kept at a prescribed position where the support member can contact the PWB 18. In the latter case, it is preferred that a support surface of the support member have a low friction coefficient so as not to resist the movement of the PWB 18. Alternatively, each of the upstream-side device which supplies the PWB 18 to the PWB conveyor 14, 226, and the downstream-side device which receives the PWB 18 from the PWB conveyor 14, 226 may employ at least one support member which supports the lower surface of the PWB 18 (preferably, plus side-positioned guide members which guide the side surfaces of the PWB 18). In the last case, the respective wound-on members of the PWB conveyor 14, 226 sandwich or release the PWB 18, in the state in which the lower surface of the PWB 18 is supported on the support member (and the side surfaces of the PWB 18 are guided by the side-positioned guide members).

In the first embodiment shown in FIGS. 1 to 3, the contact-force producing device 140 functions not only as the contact-force producing device but also the lifting device or moving device which lifts up and moves the PWB 18 away from the two round belts 40, 54. However, it is preferred to employ, in addition to the contact-force producing device 140 which lifts up one end portion of the PWB 18 from one round belt 54, an additional lifting or moving device which is provided at a position opposite to the producing device 140 with respect to the PWB 18 and which lifts up the other end portion of the PWB 18 from the other round belt 40. The additional lifting device may be one which includes, like the producing device 140, a support member, press rollers, and compression coil springs. In this case, the support member of the lifting device is supported by the frame 30, in place of the pivotable member 156, such that the support member is movable owing to elongate holes and engaging projections like the elongate holes 164, 166 and the engaging projections 152, 154. The elastic force of the springs of the lifting device is prescribed at a value lower than that of the producing device 140. When the pivotable member 156 of the producing device 140 is pivoted by the air cylinder 180 so that the two flat belts 86, 88 sandwich the PWB 18, and subsequently the pivotable member 156 is further pivoted, first, the springs of the lifting device are compressed so that the support member of the lifting device is moved upward while the press rollers press, owing to the elastic force of the springs, the flat belt 86 against the PWB 18. Thus, the other portion of the PWB 18 is moved up off the other round belt 40. As the pivotable member 156 is further pivoted, the springs 170 of the producing device 140 are compressed so that the support member 142 is moved upward while the press rollers 144 press, owing to the elastic force of the springs 170, the flat belt 88 against the PWB 18. Thus, the one end portion of the PWB 18 is moved upward off the one round belt 54. In this way, the PWB 18 is assuredly moved off the two round belts 40, 54, and a contact force is produced between the PWB 18 and each of the two flat belts 86, 88.

In the fourth embodiment shown in FIGS. 8 to 10, the two contact-force producing devices 290 are provided at respective positions corresponding to the two widthwise end portions of the PWB 18. However, it is possible to provide only a single contact-force producing devices 290 at a position corresponding to one of the two widthwise end portions of the PWB 18.

In each of the first to third embodiments shown in FIGS. 1 to 7, the contact-force producing device 140, 200, 240 is designed such that the compression coil springs 170, 212, 258 apply the biasing force to the press rollers 144, 204, 244. However, it is possible to employ at least one pressurised-fluid-operated cylinder device, such as an air-fluid-operated cylinder device, which applies, as the biasing force, its operating force to the press rollers 144, 204, 244. For example, in the first embodiment shown in FIGS. 1 to 3, the springs 170 are omitted, and the support member and the pivotable member 156 are provided by an integral member, which is pivoted by the air cylinder 180 so that the press rollers 144 are moved toward, and away from, the flat belt 86 and the flat belt 88 is pressed against the PWB 18. Thus, a contact force is produced between the PWB 18 and each of the two flat belts 86, 88. In this case, the air cylinder 180 functions as not only the biasing device but also the moving device which moves the one flat belt 88 toward and away from the other flat belt 86. The contact force may be adjusted by changing the pressure of the pressurized air supplied to the air chamber of the air cylinder 180, or may be prescribed at a constant force corresponding to a stroke end of the piston of the air cylinder 180.

In each of the first, second, and fourth embodiments shown in FIGS. 1 to 4 and 8 to 10, the moving device is employed which moves the one flat belt 88 toward and away from the other flat belt 86, or the moving device which moves the ball members 300 toward and away from the round belts 282. However, it is not essentially needed to employ the moving device. For example, in the second embodiment shown in FIG. 4, the air cylinder 180 is omitted and the pivotable member 210 is replaced with a stationary member. In this case, the limit of movement of the support member 202 caused by the biasing force of the springs 212 is defined by the stopper device including the engaging portion 214 and, the two flat belts 86, 88 are designed such that in the state in which no PWB 18 is present between the two belts 86, 88, the distance between the two belts 86, 88 is somewhat shorter than the width of each PWB 18 as measured in the Y-axis direction. Thus, when the two belts 86, 88 grasp the PWB 18, the two belts 86, 88 contact the PWB 18 with a contact force corresponding to the biasing force of the springs 212.

The biasing device may be provided by a pressurized-air-operated cylinder device which does not function as either of the above-indicated two sorts of moving devices. In this case, the limit of movement of the support member caused by the biasing force of the air cylinder, or the limit of movement of the freely rotatable member or members relative to the support member may be defined by a stroke end of the piston of the air cylinder, or the contact force with which the wound-on member or members contact the PWB 18 may be adjusted by changing the pressure of the air in the air chamber of the air cylinder.

In each of the first and second embodiments shown in FIGS. 1 to 4, the support member 142, 202 of the contact-force producing device 140, 200 is pivoted to move the one flat belt 88 toward, and away from the other flat belt 86. However, it is possible to linearly move the flat belt 88 toward, and away from, the flat belt 86. In the third embodiment shown in FIGS. 5 to 7, the contact-force producing device 240 may employ the moving device. In the last case, the support member 240 may be displaced by being pivoted or by being linearly moved.

In the fourth embodiment shown in FIGS. 8 to 10, the balls 300 as the freely rotatable members may be replaced with rollers. In addition, the two air cylinders 304 provided for each of the two support members 298 may be replaced with a single air cylinder 304 which is provided at a middle position between the two guide rods 292. Moreover, the spring 310 of each of the two cylinders 304 or the single cylinder 304 may be omitted. For example, the each cylinder 304 or the single cylinder 304 may be replaced with a double-action-type air cylinder, as the biasing device, that has two air chambers. In this case, the contact force with which the balls 300 are pressed against the PWB 18 may be prescribed at a constant force defined by a stroke end of the piston of the double-action air cylinder, or may be adjusted by changing the pressure of the air present in one of the two air chambers that is used to cause the balls 300 to contact the PWB 18. Furthermore, like in the third embodiment shown in FIGS. 5 to 7, each of the two support members 298 may support a plurality of freely rotatable members such that each of the freely rotatable members is movable toward, and away from, the PWB 18, and is biased by a corresponding one of a plurality of biasing devices.

In each of the first and second embodiments shown in FIGS. 1 to 4, the respective drive devices of the two side-positioned conveying units 90, 92 include the respective servomotors 100, 118 as their drive sources. However, the two drive devices may include a common servomotor as their common drive source. In this case, the two flat belts 86, 88 are mechanically connected to the common servomotor, so that the two belts 86, 88 are moved in synchronism with each other.

Even in the case where the PWB 18 is conveyed by the side-positioned conveying units 90, 92 in the state in which the PWB 18 is kept away from the round belts 40, 54 of the under-positioned conveying units 76, 78, all the respective drive devices of the four conveying units 76, 78, 90, 92 may include a common drive source, unless the respective wound-on members of different conveying units are concurrently circulated at different accelerations or decelerations.

It is preferred that the respective wound-on members of the side-positioned conveying units 90, 92, 228, 230 have a low friction coefficient for the purpose of guiding the movement of the PWB 18. Even the wound-on members that have a low friction coefficient can convey the PWB 18 at an acceleration higher than gravitational acceleration, if the wound-on members contact the PWB 18 with a great contact force. In the case where the PWB 18 is sufficiently hard and accordingly does not buckle when being subjected to a great contact force, the wound-on members that have a low friction coefficient can be caused to contact the PWB 18 with a great contact force. In this case, the wound-on members as the parts of the side-positioned conveying units can be easily used to not only quickly convey the PWB 18 and but also guide the movement of the PWB 18 caused by the under-positioned conveying units.

In the case where the PWB 18 is conveyed by the under-positioned conveying units 76, 78 in the state in which the flat belts 86, 88 of the side-positioned conveying units 90, 92 are kept away from the PWB 18, it is not essentially required to circulate the flat belts 86, 88 in synchronism with the round belts 40, 54, but it is possible to keep the flat belts 86, 88 stopped while the round belts 40, 54 are circulated.

It is not essentially required that each of the press rollers 144, 204, 244 have the flanges 146. Each press roller may be one which does not have any flanges.

It is not essentially required that the flat belt 88 be always kept in contact with the press rollers 144, 204, 244. For example, the flat belt 88 may be designed such that while the PWB 18 is not conveyed, the press rollers 144, 204, 244 are kept away from the flat belt 88 and, while the PWB 18 is conveyed, the press rollers 144, 204, 244 are moved toward the flat belt 86 so as to contact the flat belt 88 and press the same 88 against the PWB 18.

The rotatable wheels of the side-positioned conveying units may be used as the freely rotatable wheels of the contact-force producing device. For example, the drive and driven pulleys as the rotatable wheels may be designed such that the drive and driven pulleys on which the wound-on member is wound are movable as a unit in a direction parallel to the upper and lower surfaces of the PWB 18, and are biased by a biasing device so that the wound-on member contacts the PWB 18. The rotatable wheels may be supported by a support member, and a biasing device may be connected to the support member. Each of the rotatable wheels may be movable relative to the support member, and may be biased by a corresponding one of a plurality of biasing devices.

The present invention may be applied to an EC mounting system of any sort other than the EC mounting system illustrated in the first embodiment shown in FIGS. 1 to 3. For example, the present invention may be embodied on an EC mounting system including two EC supplying devices 10 and two EC mounting devices 12. In this system, the two EC mounting devices 12 alternately mount ECs on a single PWB 18. In addition, the EC mounting device 12 may be one which includes a movable member, at least one EC holder fixedly supported by the movable member, and a moving device which moves the movable member so that the EC holder mounts an EC on a PWB 18.

The PWB conveyor 14 may be modified to have the function of moving the PWB 18 positioned at the operation position, in at least one of the X-axis and Y-axis directions. In this case, the PWB conveyor 14 may be provided by a conveyor which includes three portions, i.e., a first portion providing the operation-wait area, a second portion providing the operation area, and a third portion providing the carry-out-wait area. The first to third portions can convey respective PWBs independent of one another, and the first and third portions convey respective PWBs in the X-axis direction. The second portion not only conveys a PWB in the X-axis direction, but also is movable to an arbitrary position in at least one of the X-axis and Y-axis directions while holding the PWB. In this case, the EC mounting device 12 may be selected from various sorts of devices, depending on the sort of the PWB conveyor 14 employed. For example, the device 12 may be one which is fixed in position, or one which is movable in at least one of the X-axis and Y-axis directions to mount ECs on a PWB 18.

In the first embodiment shown in FIGS. 1 to 3, the PWB conveyor 14 receives the PWB 18 which has been conveyed while the lower surface of the PWB 18 is supported on the under-positioned conveying units of the upstream-side device, and carries out the PWB 18 while the lower surface of the PWB 18 is supported on the under-positioned conveying units of the downstream-side device. However, it is possible that a PWB conveyor which can convey a PWB 18 at an acceleration and a deceleration higher than a maximum acceleration and a maximum deceleration which depend on the gravitational force exerted to the PWB 18, may be used to carry in, and/or carry out, a PWB 18 to, and from, the PWB conveyor 14. In this case, each PWB 18 is carried in and/or carried out between the two or three PWB conveyors which can quickly convey the PWB 18.

In the first embodiment shown in FIGS. 1 to 3, a PWB detecting device may be employed to stop the PWB 18 at each of the operation-wait position and the carry-out-wait position. The PWB detecting device may be identical with the PWB detecting device 274 employed in the third embodiment shown in FIGS. 5 to 7, that is, include the two PWB sensors 276, 278, or alternatively may be one which includes only one PWB sensor.

In the case where a plurality of systems or devices of the PCB-producing line are connected to each other by a PWB conveyor, the present invention is applicable to that PWB conveyor or a PWB conveying method which is performed by that PWB conveyor.

The present invention is applicable to not only the respective PWB conveyors of the systems and devices of the PCB producing line and the PWB conveyor or conveyors connecting between those systems and devices, but also PWB conveyors and PWB conveying methods which are employed in other systems than the systems of the PCB producing line, and PWB conveyors and PWB conveying methods which are used to connect between those other systems.

While the present invention has been described in its preferred embodiments, the present invention is not limited to the features described in SUMMARY OF THE INVENTION and the features described in DETAILED DESCRIPTION OF THE PREFERRED EMBODIMENTS, and may be embodied with other changes, improvements, and modifications that may occur to a person skilled in the art without departing from the scope and spirit of the invention defined in the appended claims.

What is claimed is:

1. A method of causing a wound-on belt to contact a printed wiring board and conveying the printed wiring board by utilizing a frictional force produced between the wound-on belt and the printed wiring board, the method comprising the steps of:

providing two conveying units each of which includes a wound-on belt and two rotatable wheels on which the wound-on belt is wound to have a straightly extending portion which straightly extends between the two rotatable wheels, such that the two conveying units are spaced from each other in a direction parallel to a printed wiring board, and such that the respective straightly extending portions of the two wound-on belts of the two conveying units cooperate with each other to engage opposite side surfaces of the printed wiring board, respectively, and sandwich the printed wiring board in a direction substantially parallel to the printed wiring board, and conveying the printed wiring board by rotating the rotatable wheels of the two conveying units, and thereby moving the two wound-on belts, while utilizing a frictional force produced between each of the two wound-on belts and the printed wiring board.

2. A method according to claim 1, wherein each of the two wound-on belts has a friction coefficient not smaller than about 0.3.

3. A method according to claim 1, wherein each of the two wound-on belts is formed of rubber.

4. A printed-wiring-board conveyor, comprising:

at least one wound-on belt;

at least two rotatable wheels on which the wound-on belt is wound to have a straightly extending portion which straightly extends between the two rotatable wheels and which contacts one of opposite side surfaces of a printed wiring board;

a contact-force producing device which causes the straightly extending portion of the wound-on belt and said one of the opposite side surfaces of the printed wiring board to contact each other with a contact force greater than a weight of the printed wiring board; and a drive device which drives at least one of the two rotatable wheels and thereby moves the wound-on belt and the printed wiring board while utilizing a frictional force produced between the wound-on belt and the printed wiring board.

5. A conveyor according to claim 4, further comprising, in addition to said wound-on belt as a first wound-on belt, a second wound-on belt, and, in addition to said two rotatable wheels as two first rotatable wheels, two second rotatable wheels on which the second wound-on belt is wound to have a straightly extending portion which straightly extends between the two second rotatable wheels and which contacts the other of the opposite side surfaces of the printed wiring board, wherein the respective straightly extending portions of the first and second wound-on belts extend parallel to each other in a first direction and are spaced from each other in a second direction, and the contact-force producing device biases one of the respective straightly extending portions of the first and second wound-on belts, toward the other of said respective straightly extending portions.

6. A conveyor according to claim 5, wherein the contact-force producing device comprises:

at least one freely rotatable member which is rotatable about an axis line perpendicular to the first and second directions and which contacts one of opposite surfaces of said one of said respective straightly extending portions that is opposite to the other surface thereof at which said one of said respective straightly extending portions contacts said one of the opposite side surfaces of the printed wiring boards; and a biasing device which applies a biasing force to the freely rotatable member in a direction in which said one of said respective straightly extending portions is biased toward said other of said respective straightly extending portions.

7. A conveyor according to claim 6, wherein the contact-force producing device comprises a plurality of said freely rotatable members, and a support member which supports the freely rotatable members along a straight line parallel to said one of said respective straightly extending portions, the biasing device being connected to the support member.

8. A conveyor according to claim 7, wherein the contact-force producing device further comprises a stopper which stops movement of the support member caused by the biasing force of the biasing device and thereby defines a limit of the movement of the support member.

9. A conveyor according to claim 6, wherein the contact-force producing device comprises a plurality of said freely rotatable members, a support member which supports the freely rotatable members along a straight line parallel to said one of said respective straightly extending portions, such that each of the freely rotatable members is movable in a direction perpendicular to the straight line, and a plurality of said biasing devices each of which is provided between the support member and a corresponding one of the freely rotatable members and biases said one of the freely rotatable members relative to the support member toward said one of said respective straightly extending portions.

10. A conveyor according to claim 9, wherein the contact-force producing device further comprises a plurality of stoppers each of which stops movement relative to the support member of a corresponding one of the freely rotatable members caused by the biasing force of a corresponding one of the biasing devices and thereby defines a limit of the movement of said one freely rotatable member.

11. A conveyor according to claim 6, wherein the biasing device comprises an elastic member which applies, as the biasing force, an elastic force to the freely rotatable member.

12. A conveyor according to claim 6, wherein the biasing device comprises a pressurized-air-operated cylinder device which applies, as the biasing force, an operating force to the freely rotatable member.

13. A conveyor according to claim 5, further comprising a support device which supports said other of said respective straightly extending portions on one of opposite sides thereof that is opposite to the other side thereof on which said one of said respective straightly extending portions is provided.

14. A conveyor according to claim 13, wherein the support device comprises a support member which has a contact surface which contacts one of opposite surfaces of said other of said respective straightly extending portions that is opposite to the other surface thereof at which said other of said respective straightly extending portions contacts said other of the opposite side surfaces of the printed wiring board.

15. A conveyor according to claim 5, further comprising a moving device which moves at least one of the first and second wound-on belts toward, and away from, the other of the first and second wound-on belts.

16. A conveyor according to claim 4, wherein the two rotatable wheels comprise two pulleys.

17. A conveyor according to claim 4, wherein the wound-on belt has a friction coefficient not smaller than about 0.3.

18. A conveyor according to claim 4, wherein the wound-on belt is formed of rubber.

19. A printed-wiring-board conveyor, comprising:
a first wound-on member;
a second wound-on member;
two first rotatable wheels on which the first wound-on member is wound to have a straightly extending portion which straightly extends between the two first rotatable wheels and which contacts one of opposite side surfaces of a printed wiring board;
two second rotatable wheels on which the second wound-on member is wound to have a straightly extending portion which straightly extends between the two second rotatable wheels and which contacts the other of the opposite side surfaces of the printed wiring board, wherein the respective straightly extending portions of the first and second wound-on members extend parallel to each other;
a contact-force producing device which biases at least one of the respective straightly extending portions of the first and second wound-on members, toward the other of said respective straightly extending portions and thereby causes said respective straightly extending portions to sandwich the printed wiring board with a contact force greater than a weight of the printed wiring board; and
a first drive device which drives at least one of the two first rotatable wheels and the two second rotatable wheels and thereby moves the first and second wound-on members and the printed wiring board while utilizing a frictional force produced between each of the first and second wound-on members and the printed wiring board,
wherein the respective straightly extending portions of the first and second wound-on members are spaced from each other in a substantially horizontal direction, and
wherein the conveyor further comprises at least two third rotatable wheels, at least one third wound-on member which is provided between the respective straightly extending portions of the first and second wound-on members and which is wound on the two third rotatable wheels to have a straightly extending portion which straightly extends parallel to the respective straightly extending portions of the first and second wound-on members, and a second drive device which drives at least one of the third rotatable wheels.

20. A conveyor according to claim 19, further comprising, in addition to said third wound-on member which corresponds to the first wound-on member, a fourth wound-on member which corresponds to the second wound-on member, and, in addition to said two third rotatable wheels on which the third wound-on member is wound and which correspond to the two first rotatable wheels, two fourth rotatable wheels on which the fourth wound-on member is wound and which correspond to the two second rotatable wheels.

21. A conveyor according to claim 19, wherein the first drive device comprises a first-rotatable-wheel drive device which drives at least one of the two first rotatable wheels and a second-rotatable-wheel drive device which drives at least one of the two second rotatable wheels.

22. A conveyor according to claim 19, wherein the second drive device is different from the first drive device.

23. A conveyor according to claim 19, wherein the straightly extending portion of the third wound-on member contacts a lower surface of the printed circuit-board, and wherein the second drive device drives said at least one of the third rotatable wheels and thereby moves the third wound-on member and the printed wiring board while utilizing a frictional force which is produced between the third wound-on member and the printed wiring board owing to the weight of the printed wiring board.

24. A printed-wiring-board conveyor comprising:
at least one wound-on member;
at least two rotatable wheels on which the wound-on member is wound to have a straightly extending portion which straightly extends between the two rotatable wheels and which contacts a printed wiring board;
a contact-force producing device which causes the straightly extending portion of the wound-on member and the printed wiring board to contact each other with a contact force greater than a weight of the printed wiring board; and
a drive device which drives at least one of the two rotatable wheels and thereby moves the wound-on member and the printed wiring board while utilizing a frictional force produced between the wound-on member and the printed wiring board,
wherein the straightly extending portion of the wound-on member extends in a substantially horizontal direction, and
wherein the contact-force producing device comprises:
at least one freely rotatable member which is provided above the straightly extending portion of the wound-on member such that the freely rotatable member is freely rotatable about a substantially horizontal axis line perpendicular to the substantially horizontal direction, and which contacts an upper surface of the printed wiring board whose lower surface is supported on the straightly extending portion of the wound-on member; and
a biasing device which biases the freely rotatable member toward the upper surface of the printed wiring board.

25. A conveyor according to claim 24, wherein the biasing device comprises a moving device which moves the freely rotatable member toward, and away from, the straightly extending portion of the wound-on member.

* * * * *